United States Patent
Inoue et al.

(10) Patent No.: US 6,737,322 B2
(45) Date of Patent: May 18, 2004

(54) METHOD FOR MANUFACTURING SEMICONDUCTOR DEVICE

(75) Inventors: Susumu Inoue, Sakata (JP); Akihiko Ebina, Fujimi-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/379,387

(22) Filed: Mar. 4, 2003

(65) Prior Publication Data

US 2003/0194841 A1 Oct. 16, 2003

(30) Foreign Application Priority Data

Mar. 6, 2002 (JP) ........................................ 2002-060750

(51) Int. Cl.[7] ............................................ H01L 21/336
(52) U.S. Cl. ........................ 438/267; 438/265; 438/257; 438/261; 438/382
(58) Field of Search ................................. 438/257–267, 438/382–385

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |
| 6,413,821 B1 | 7/2002 | Ebina et al. |
| 6,518,124 B1 | 2/2003 | Ebina et al. |
| 2002/0100929 A1 | 8/2002 | Ebina et al. |
| 2002/0127805 A1 | 9/2002 | Ebina et al. |
| 2003/0054610 A1 | 3/2003 | Ebina et al. |
| 2003/0057505 A1 | 3/2003 | Ebina et al. |
| 2003/0058705 A1 | 3/2003 | Ebina et al. |
| 2003/0060011 A1 | 3/2003 | Ebina et al. |

FOREIGN PATENT DOCUMENTS

| | | |
|---|---|---|
| JP | 7-161851 | 6/1995 |
| JP | 2978477 | 9/1999 |
| JP | 2001-156188 | 6/2001 |

OTHER PUBLICATIONS

Chen, et al., "A Novel Flash Memory Device with S Plit Gate Source Side Injection and ONO Charge Storage Stack (SPIN)," 1997 Symposium on VLSI Technology Digest of Technical Papers, pp. 63–64.

Chang, et al., "A New SONOS Memory Using Source–Side Injection for Programming," IEEE Electron Device Letters, vol. 19, No. 7, Jul. 1998, pp. 253–255.

Hayashi, et al., "Twin MONOS Cell with Dual Control Gates," 2000 Symposium on VLSI Technology Digest of Technical Papers (2 pages).

*Primary Examiner*—Amir Zarabian
*Assistant Examiner*—Christy Novacek
(74) *Attorney, Agent, or Firm*—Harness, Dickey & Pierce, P.L.C.

(57) ABSTRACT

A method for manufacturing a semiconductor device including a non-volatile memory device and a resistance element including a resistance conductive layer is provided. The method comprises the following steps: a step of patterning a stopper layer and a first conductive layer to form a gate layer; a step of patterning the stopper layer, a dielectric layer and the first conductive layer to form a resistance conductive layer; a step of forming sidewall-like control gates on both side surfaces of the gate layer through ONO films at least within a memory region; a step of forming a second conductive layer above the gate layer and the resistance conductive layer; a step of forming a word line by patterning the second conductive layer; and a step of forming a word gate by patterning the gate layer.

3 Claims, 22 Drawing Sheets

METHOD FOR MANUFACTURING SEMICONDUCTOR DEVICE

TECHNICAL FIELD

The present invention relates to a method for manufacturing a non-volatile memory device and a method for manufacturing a semiconductor device including the non-volatile memory device, and more particularly to a method for manufacturing a non-volatile memory device having a plurality of charge storage regions for each word gate, and a method for manufacturing a semiconductor device including the non-volatile memory device.

BACKGROUND

Non-volatile semiconductor memory devices include a MONOS (Metal Oxide Nitride Oxide Semiconductor) type and a SONOS (Silicon Oxide Nitride Oxide Silicon) type in which a gate dielectric layer between a channel region and a control gate is composed of a stacked layered body of a silicon oxide layer—a silicon nitride layer—a silicon oxide layer, wherein a charge is trapped in the silicon nitride layer.

One known MONOS type non-volatile memory device is shown in FIG. 22, (Y. Hayashi, et al, 2000 Symposium on VLSI Technology Digest of Technical Papers p.122-p.123).

The MONOS type memory cell 100 has a word gate 14 formed over a semiconductor substrate 10 through a first gate dielectric layer 12. Also, a first control gate 20 and a second control gate 30 in the form of sidewalls are disposed on both sides of the word gate 14. A second gate dielectric layer 22 is present between a bottom section of the first control gate 20 and the semiconductor substrate 10, and a dielectric layer 24 is present between a side surface of the first control gate 20 and the word gate 14. Similarly, a second gate dielectric layer 22 is present between a bottom section of the second control gate 30 and the semiconductor substrate 10, and a dielectric layer 24 is present between a side surface of the second control gate 30 and the word gate 14. Impurity layers 16 and 18 that each compose a source region or a drain region are formed in the semiconductor substrate 10 between the opposing control gates 20 and 30 of adjacent memory cells.

In this manner, each memory cell 100 includes two MONOS type memory elements on the side surfaces of the word gate 14. Also, these two MONOS type memory elements are independently controlled. Therefore, a single memory cell 100 can store 2-bit information.

In view of the foregoing, one object of the present invention is to provide a method for manufacturing a MONOS type non-volatile memory device having a plurality of charge storing regions and a method for manufacturing a semiconductor device including the non-volatile memory device.

SUMMARY

A method for manufacturing a semiconductor device including a non-volatile memory device, and a resistance element including a resistance conductive layer in accordance with an embodiment of the present invention comprises the following. A first dielectric layer is formed above a semiconductor layer and a first conductive layer is formed above the first dielectric layer. A second dielectric layer is formed above a portion of the first conductive layer that becomes the resistance conductive layer. A stopper layer is formed above the first conductive layer and the second dielectric layer. The stopper layer and the first conductive layer are patterned to form a gate layer. The stopper layer, the second dielectric layer and the first conductive layer are patterned to form the resistance conductive layer Sidewall-like control gates are formed through an ONO film on both side surfaces of the gate layer. A third dielectric layer is formed above the gate layer and the resistance conductive layer. The third dielectric layer is polished such that the stopper layer is exposed and then the stopper layer is removed. A second conductive layer is formed above the gate layer and the resistance conductive layer. The second conductive layer is then patterned to form a word line. Finally, the gate layer is patterned to form a word gate.

A method for manufacturing a semiconductor device including a non-volatile memory device, and a resistance element including a resistance conductive layer in accordance with another embodiment of the present invention comprises the following. A first dielectric layer is formed above a semiconductor layer and a first conductive layer is formed above the first dielectric layer. A stopper layer is formed above the first conductive layer. The stopper layer and the first conductive layer are patterned to form a gate layer and the resistance conductive layer. Sidewall-like control gates are formed through an ONO film on both side surfaces of the gate layer The stopper layer formed above the resistance conductive layer is then removed. A second dielectric layer is formed above at least the resistance conductive layer. A third dielectric layer is formed above the gate layer and the resistance conductive layer. The third dielectric layer is then polished such that the stopper layer is exposed, and the second dielectric layer formed above the resistance conductive layer remains. The stopper layer is then removed. A second conductive layer is formed above the gate layer and the resistance conductive layer. Next, the second conductive layer is patterned to form a word line. Finally, the gate layer is patterned to form a word gate.

DETAILED DESCRIPTION

First Embodiment

Figure 1:
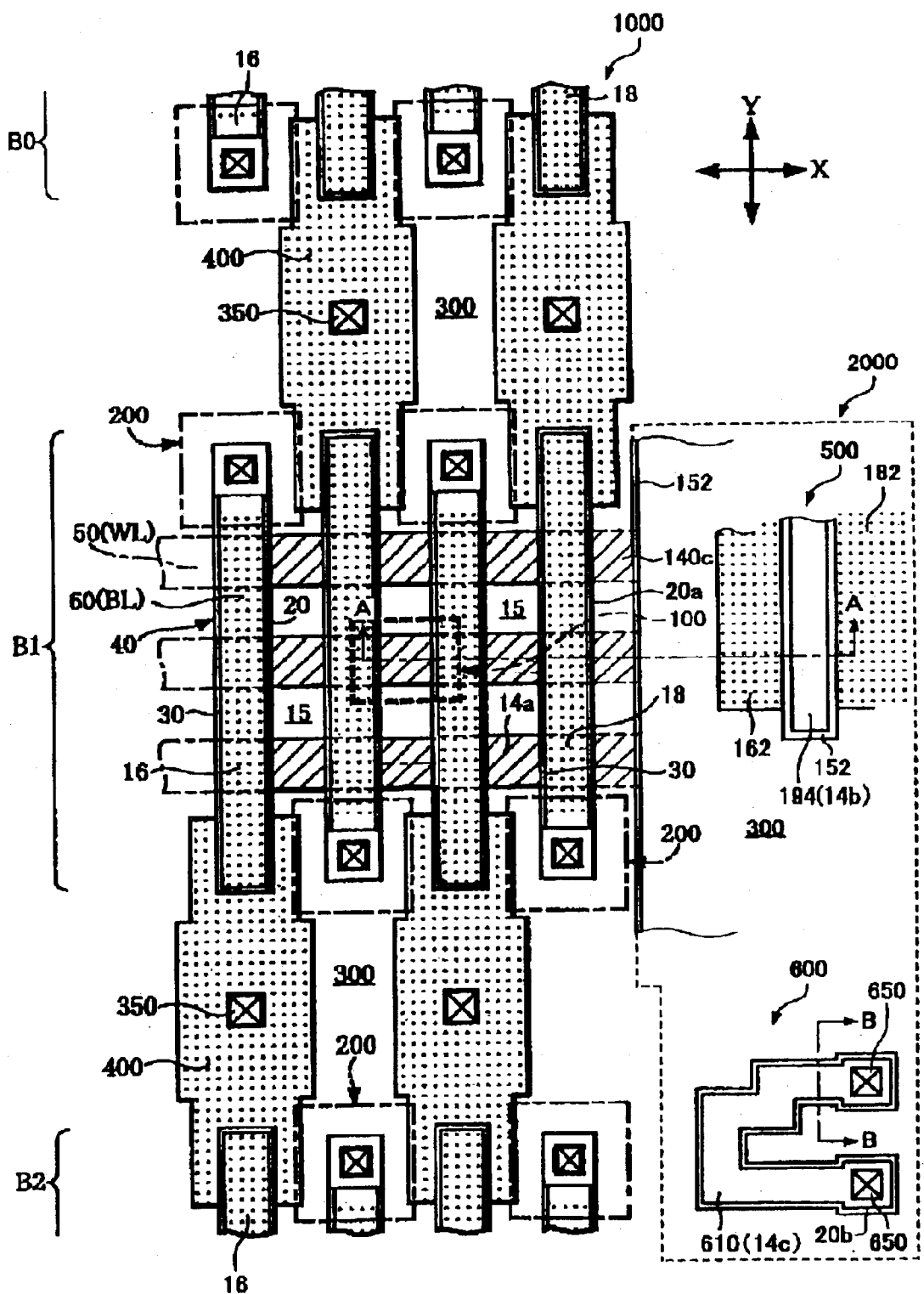
FIG. 1 schematically shows a plan view illustrating a layout of a semiconductor device.

1. Structure of a Semiconductor Device:

FIG. 1 is a plan view illustrating a layout of a semiconductor device that is obtained by a manufacturing method in accordance with a first embodiment of the present invention. The semiconductor device includes a memory region 1000 and a logic circuit region 2000. For example, a peripheral circuit for the memory and a resistance element 600 are formed in the logic circuit region 2000.

MONOS type non-volatile memory devices (hereafter referred to as "memory cells") are arranged in a plurality of rows and columns in a matrix configuration in the memory region 1000. In the memory region 1000, a first block B1 and parts of adjacent other blocks B0 and B2 are shown. Each of the blocks B0 and B2 has a structure that is the reverse of that of the block B1.

An element isolation region 300 is formed in a part of the region between the first block B1 and the adjacent blocks B0 and B2. A plurality of word lines (WL) 50 extending in an X direction (row direction) and a plurality of bit lines (BL) 60 extending in a Y direction (column direction) are provided in each of the blocks. Each one of the word lines 50 is connected to a plurality of word gates 14a arranged in the X direction. The bit lines 60 are composed of impurity layers 16 and 18.

A conductive layer 40, which composes the first and second control gates 20 and 30, is formed in a manner to enclose each of the impurity layers 16 and 18. In other words, the first and second control gates 20 and 30 extend respectively in the Y direction, and first end sections of one set of the first and second control gates 20 and 30 are mutually connected by the conductive layer that extends in the X direction. Further, the other end sections of the one set of the first and second control gates 20 and 30 are both connected to one common contact section 200. Therefore, the conductive layer 40 functions as a control gate of a memory cell, and functions as a wiring that connects the control gates together that are arranged in the Y direction.

Each memory cell 100 includes one word gate 14a, first and second control gates 20 and 30, and impurity layers 16 and 18. The first and second control gates 20 and 30 are formed on both sides of the word gate 14a. The impurity layers 16 and 18 are formed on outer sides of the control gates 20 and 30. The impurity layers 16 and 18 are commonly shared by adjacent ones of the memory cells 100.

The impurity layers 16 that are mutually arranged adjacent to each other in the Y direction, i.e., the impurity layer 16 formed in the block B1 and the impurity layer 16 formed in the block B2, are mutually electrically connected by a contact impurity layer 400 that is formed within the semiconductor substrate. The contact impurity layer 400 is formed on the opposite side of the common contact section 200 of the control gates with respect to the impurity layer 16.

A contact 350 is formed on the contact impurity layer 400. The bit lines 60 composed of the impurity layers 16 are electrically connected to wiring layers in upper layers through the contact 350.

Similarly, two adjacent ones of the impurity layers 18 arranged in the Y direction, i.e., the impurity layer 18 formed in the block B1 and the impurity layer 18 formed in the block B0, are mutually electrically connected by the contact impurity layer 400 on the side where the common contact section 200 is not disposed. As seen in FIG. 1, in each of the blocks, the plurality of common contact sections 200 for the impurity layers 16 and the impurity layers 18 are arranged on mutually opposite sides in a staggered fashion as viewed in a plan view layout. Also, in each of the blocks, the plurality of contact impurity layers 400 for the impurity layers 16 and the impurity layers 18 are arranged on mutually opposite sides in a staggered fashion as viewed in a plan view layout.

At least dielectric gate field effect transistors (hereafter referred to as "MOS transistors") 500 that form a logic circuit are formed in the logic circuit region 2000. The MOS transistor 500 includes a gate electrode 14b, impurity layers 162 and 182, and sidewall dielectric layers 152. A silicide layer 194 is formed on an upper surface of the gate electrode 14b.

Also, the resistance element 600 is formed in the logic circuit region 2000. However, a region where the resistance element 600 is formed is not limited to the logic circuit region 2000, but may also be formed in the memory region 1000.

The resistance element 600 includes a resistance conductive layer 14c. A dielectric layer (a second dielectric layer in the present embodiment) 610 having opening sections is formed above the resistance conductive layer 14c. Also, contact layers 650 are formed within the opening sections. The resistance element 600 can be used for, for example, a charge pump circuit, a circuit for switching frequencies of an oscillation circuit, and the like.

Figure 2:
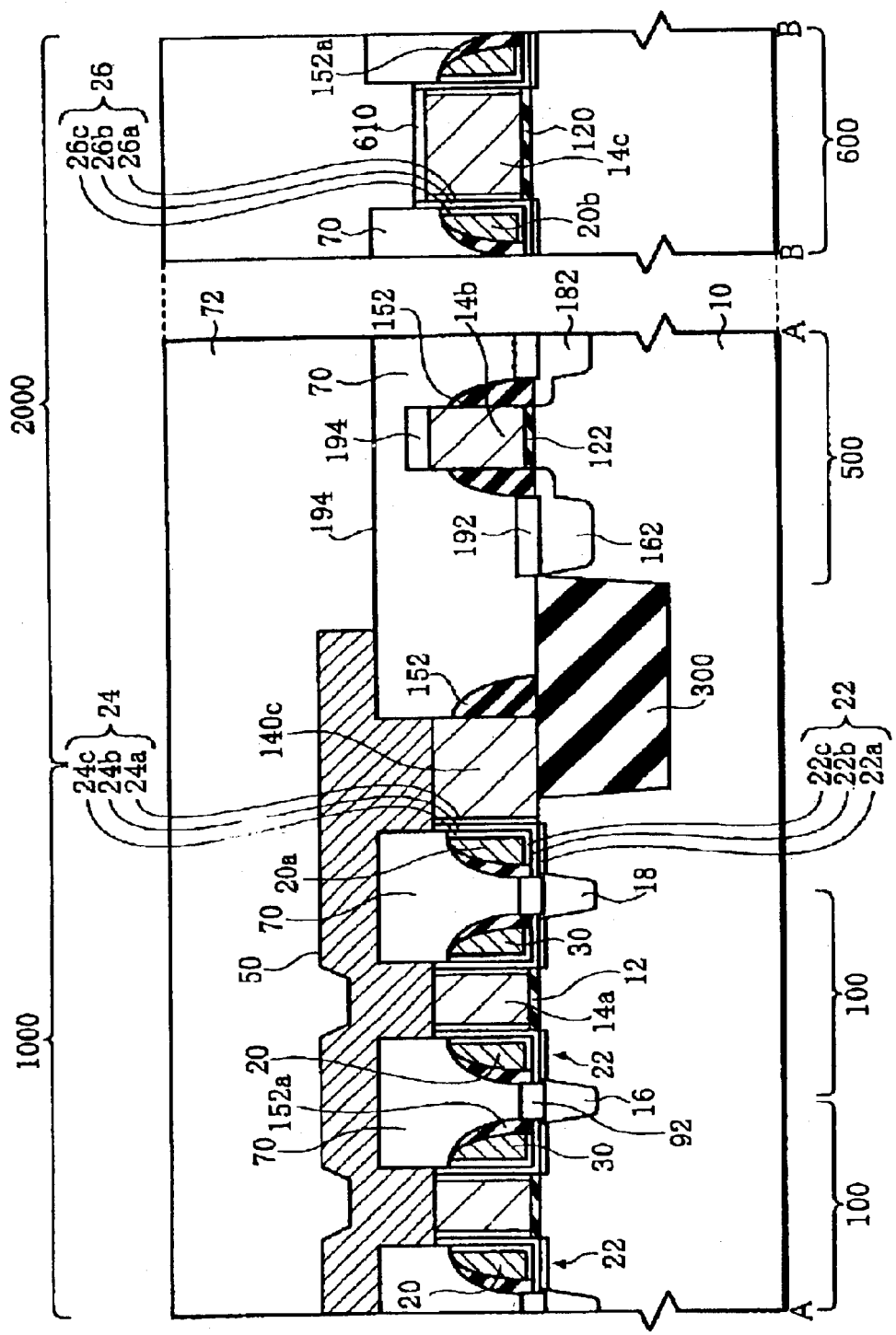
FIG. 2 schematically shows a cross-sectional view taken along line A—A of FIG. 1.

Next, referring to FIG. 2, a cross-sectional structure of the semiconductor device is described. FIG. 2 is a cross-sectional view taken along line A—A of FIG. 1.

First, the memory region 1000 is described. The memory cell 100 includes a word gate 14a, impurity layers 16 and 18, a first control gate 20 and a second control gate 30. The word gate 14a is formed above the semiconductor substrate 10 through a first gate dielectric layer 12. The impurity layers 16 and 18 are formed in the semiconductor substrate 10. Each of the impurity layers is to become a source region or a drain region. Also, suicide layers 92 are formed on the impurity layers 16 and 18.

The first and second control gates 20 and 30 are formed along both sides of the word gate 14a. The first control gate 20 is formed above the semiconductor substrate 10 through a second gate dielectric layer 22, and formed on one of the side surfaces of the word gate 14a through a side dielectric layer 24. Similarly, the second control gate 30 is formed above the semiconductor substrate 10 through a second gate dielectric layer 22, and formed on the other side surface of the word gate 14a through a side dielectric layer 24. A cross-sectional configuration of each of the control gates is similar to the cross-sectional configuration of a sidewall dielectric layer on a conventional MOS transistor.

The second gate dielectric layer 22 is an ONO film. More specifically, the second gate dielectric layer 22 is a stacked layered film composed of a bottom silicon oxide layer (a first silicon oxide layer) 22a, a silicon nitride layer 22b and a top silicon oxide layer (second silicon oxide layer) 22c. The first silicon oxide layer 22a forms a potential barrier between a channel region and a charge storing region. The silicon nitride layer 22b functions as a charge storing region that traps carriers (for example, electrons). The second silicon oxide layer 22c forms a potential barrier between the control gate and the charge storing region.

The side dielectric layer 24 is an ONO film. More specifically, the side dielectric layer 24 is composed of a stacked layered film of a first silicon oxide layer 24a, a silicon nitride layer 24b and a second silicon oxide layer 24c. The side dielectric layers 24 electrically isolates the word gate 14a from the control gates 20 and 30, respectively. Also, the upper ends of the side dielectric layers 24 are positioned above the upper ends of the control gates 20 and 30 with respect to the semiconductor substrate 10 in order to prevent short-circuits of the word gate 14a and the first and second control gates 20 and 30. The side dielectric layers 24 and the second gate dielectric layers 22 are formed in the same film forming steps, and have the same layered structure.

A dielectric layer 70 is formed between the adjacent first control gate 20 and second control gate 30 of adjacent ones of the memory cells 100. The dielectric layer 70 covers the control gates 20 and 30 such that at least the gates 20 and 30 are not exposed. Furthermore, an upper surface of the dielectric layer 70 is positioned above an upper surface of the word gate 14a with respect to the semiconductor substrate 10. By forming the dielectric layer 70 in this manner, electrical isolation of the first and second control gates 20 and 30 from the word gate 14a and the word line 50 can be more surely achieved.

A MOS transistor 500 is formed in the logic circuit region 2000. The gate electrode 14b is formed above the semiconductor substrate 10 through a third gate dielectric layer 122. The suicide layer 194 is formed on the upper surface of the gate electrode 14b. The impurity layers 162 and 182 are formed in the semiconductor substrate 10. Each of the impurity layers composes a source region or a drain region. Further, silicide layers 192 are formed on the impurity layers 162 and 182. Sidewall dielectric layers 152 are respectively formed along two sides of the gate electrode 14b.

Also, the resistance element 600 is formed in the logic circuit region 2000. The resistance conductive layer 14c that composes the resistance element 600 is formed above the semiconductor substrate 10 through a dielectric layer 120. A dielectric layer 610 is formed above the resistance conductive layer 14c. Also, a dielectric layer 26 is formed on the side surfaces of the resistance conductive layer 14c. The dielectric layer 26 is composed of dielectric layers 26a, 26b and 26c, which are composed of the same materials as those of the bottom silicon oxide layer 22a, silicon nitride layer 22b and top silicon oxide layer 22c, respectively, which form the second gate dielectric layer 22. On the side surfaces of the resistance conductive layer 14c are formed sidewall-like conductive layers 20b composed of the same material of the control gates 20 and 30 through the dielectric layer 26.

The MOS transistor 500 is covered by a dielectric layer 70 in the logic circuit region 2000.

A boundary section 140c, which is composed of the same material as that of the word gate 14a and the gate electrode 14b, is formed in a boundary region between the memory region 1000 and the logic circuit region 2000, as shown in FIGS. 1 and 2. A sidewall-like conductive layer 20a, which is composed of the same material as that of the control gates 20 and 30, is formed on one of the side surfaces of the boundary section 140c (on the side of the memory region 1000). Also, a sidewall-like dielectric layer 152, which is formed in the same steps in which the sidewall dielectric layer 152 of the MOS transistor 500 is formed, is formed on the other side surface of the boundary section 140c (on the side of the logic circuit region 2000). An interlayer dielectric layer 72 is formed above the semiconductor substrate 10 in which the memory cells 100 and MOS transistors 500 are formed.

2. Method for Manufacturing a Semiconductor Device:

Next, referring to FIGS. 3–17, a method for manufacturing a semiconductor device in accordance with a first embodiment of the present invention is described. Each cross-sectional view shown corresponds to a cross section taken along line A—A of FIG. 1. Also, portions in FIGS. 3–17 that are substantially the same as the portions indicated in FIGS. 1 and 2 are assigned the same reference numbers, and their description is not repeated.

Figure 3:
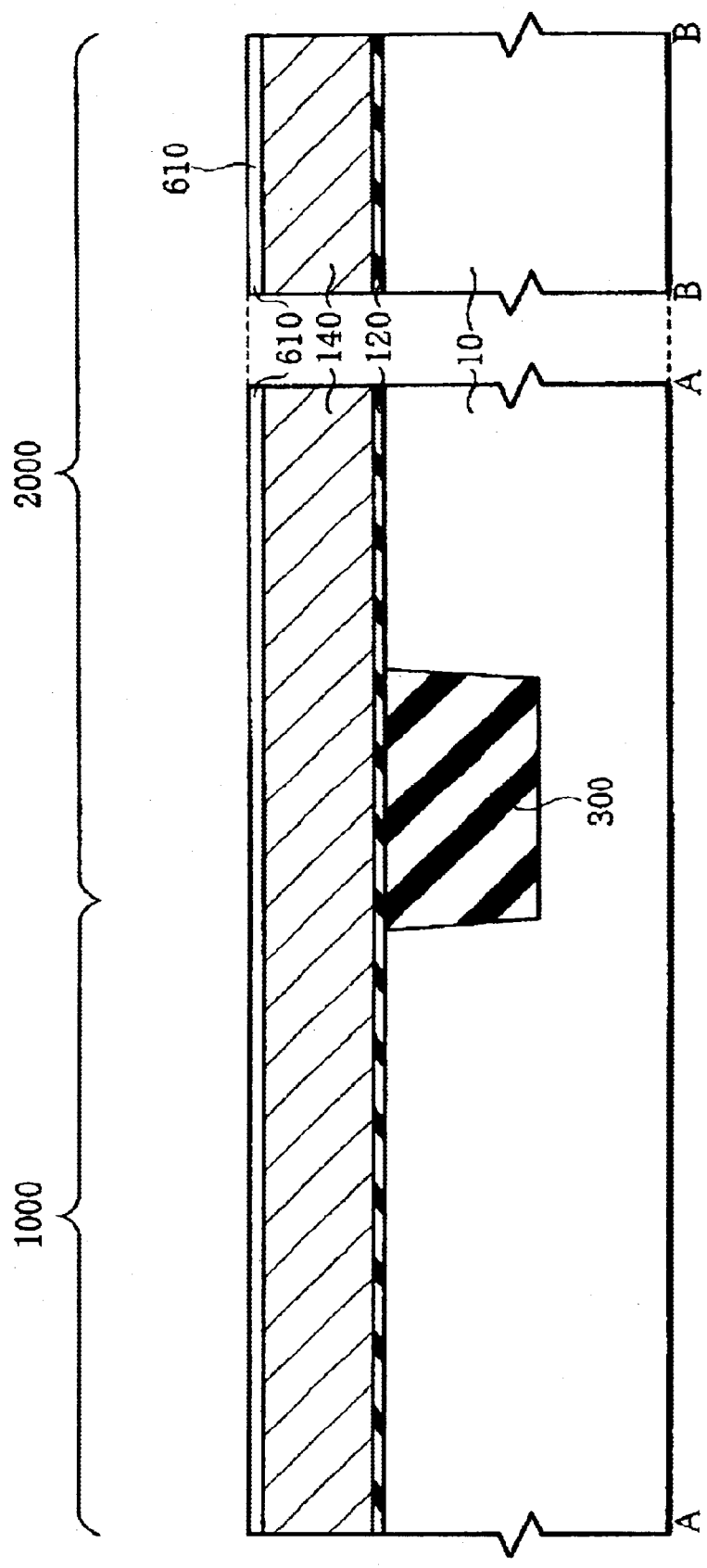
FIG. 3 shows one step in accordance with a first embodiment of the present invention.

(1) First, as shown in FIG. 3, an element isolation region 300 is formed on a surface of a semiconductor substrate 10 by a trench isolation method. Then, a contact N-type impurity layer 400 (see FIG. 1) is formed in the semiconductor substrate 10 by an ion implantation.

Next, a dielectric layer 120 that is to become a gate dielectric layer is formed on the surface of the semiconductor substrate 10. Then, a gate layer 140 (first conductive layer) that is to become word gate 14a and gate electrode 14b is deposited on the dielectric layer 120. The gate layer 140 is desirably composed of doped polysilicon.

Then, an annealing treatment is conducted to activate the N-type impurity included in the gate layer 140. The annealing treatment oxidizes an upper surface of.the gate layer 140 to form a dielectric layer 610 (i.e., a second dielectric layer in the present embodiment) in the upper surface of the gate layer 140.

Figure 4:
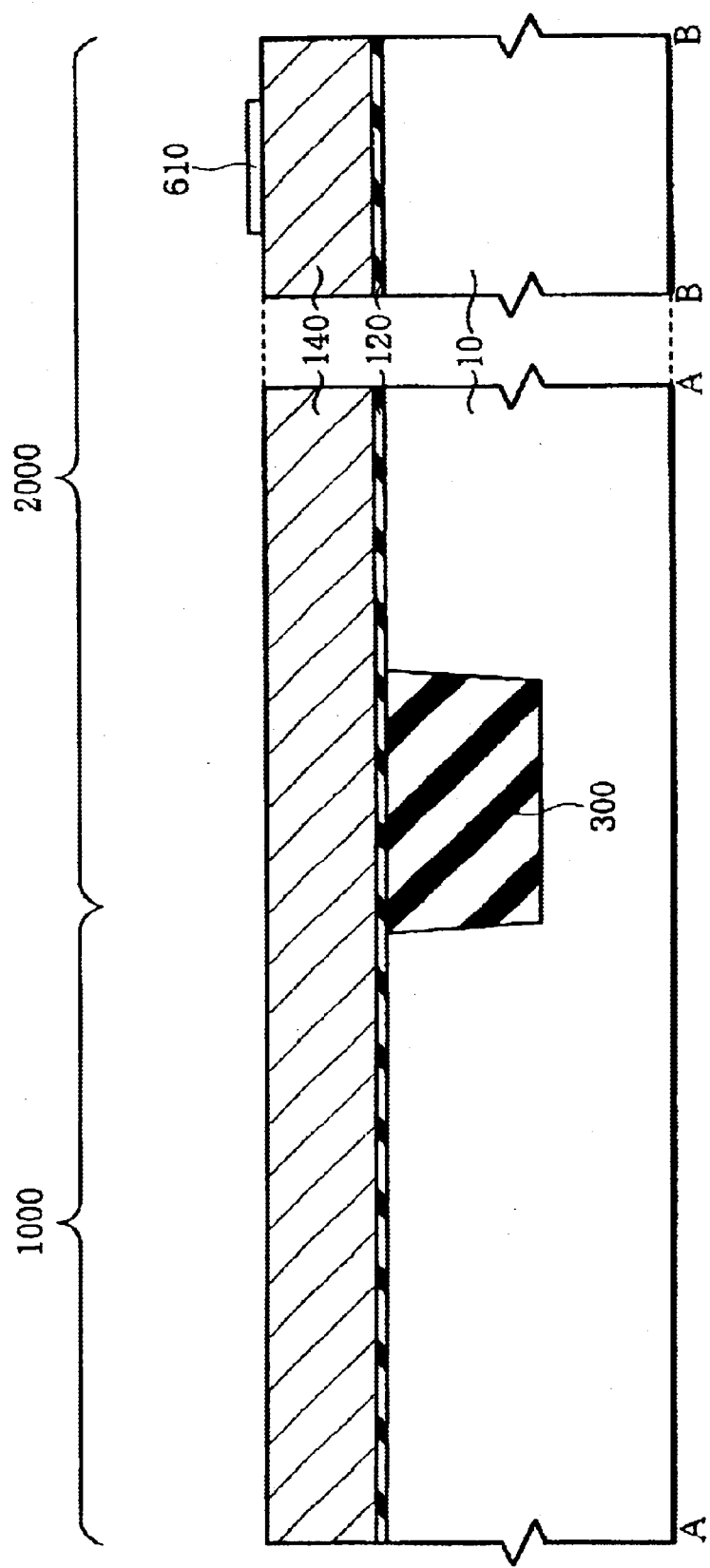
FIG. 4 shows one step in accordance with the first embodiment of the present invention.

(2) Then, in the logic region 2000, a resist layer (not shown) is formed in a region of the dielectric layer 610 where a resistance element 600 is to be formed in steps to be described later. Then, the dielectric layer 610 is patterned using the resist layer as a mask. As a result, as shown in FIG. 4, the dielectric layer 610 remains only in a region where the resistance element 600 is to be formed.

Figure 5:
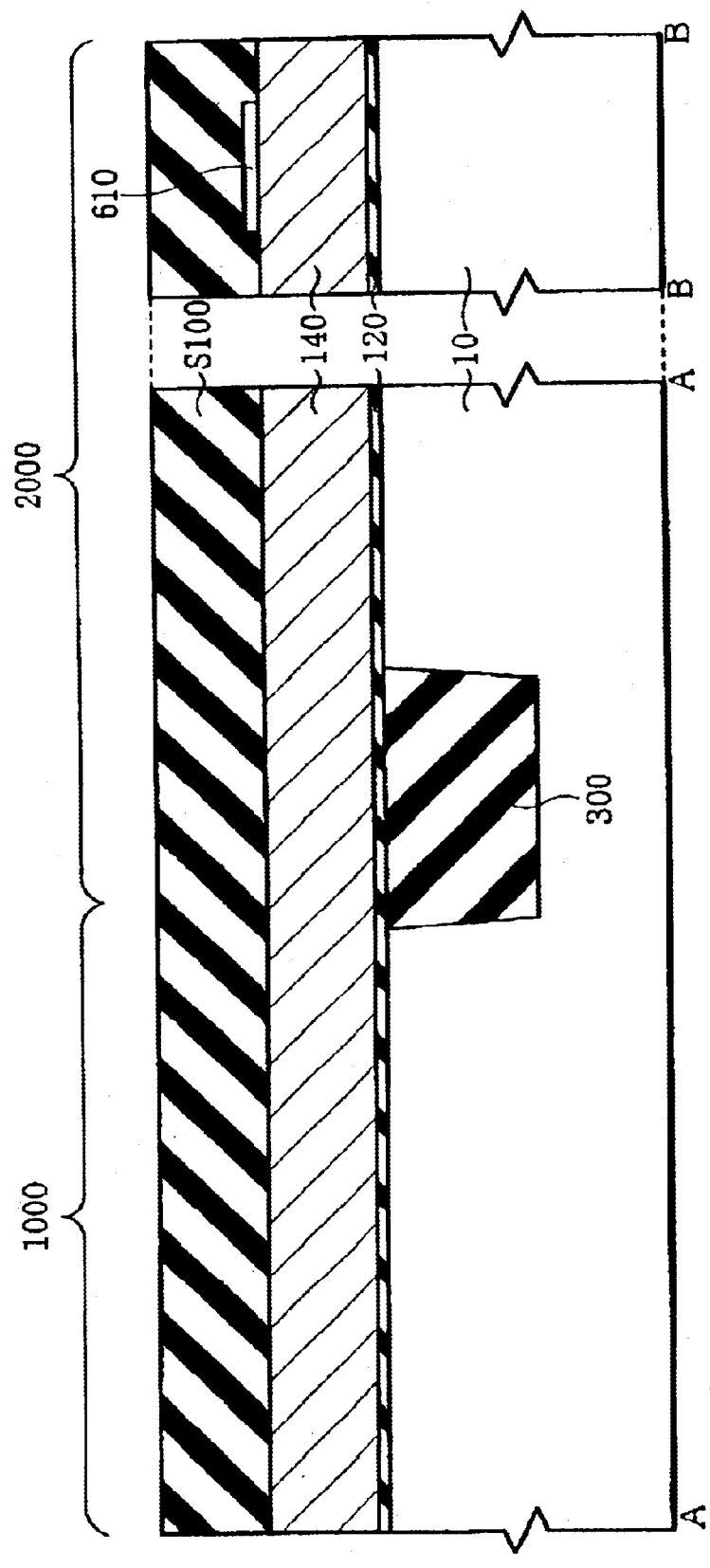
FIG. 5 shows one step in accordance with the first embodiment of the present invention.

(3) Then, a stopper layer S100 that is to be used in a CMP step to be conducted later is formed over the gate layer 140, as shown in FIG. 5. The stopper layer S100 is desirably composed of a silicon nitride layer.

Figure 6:
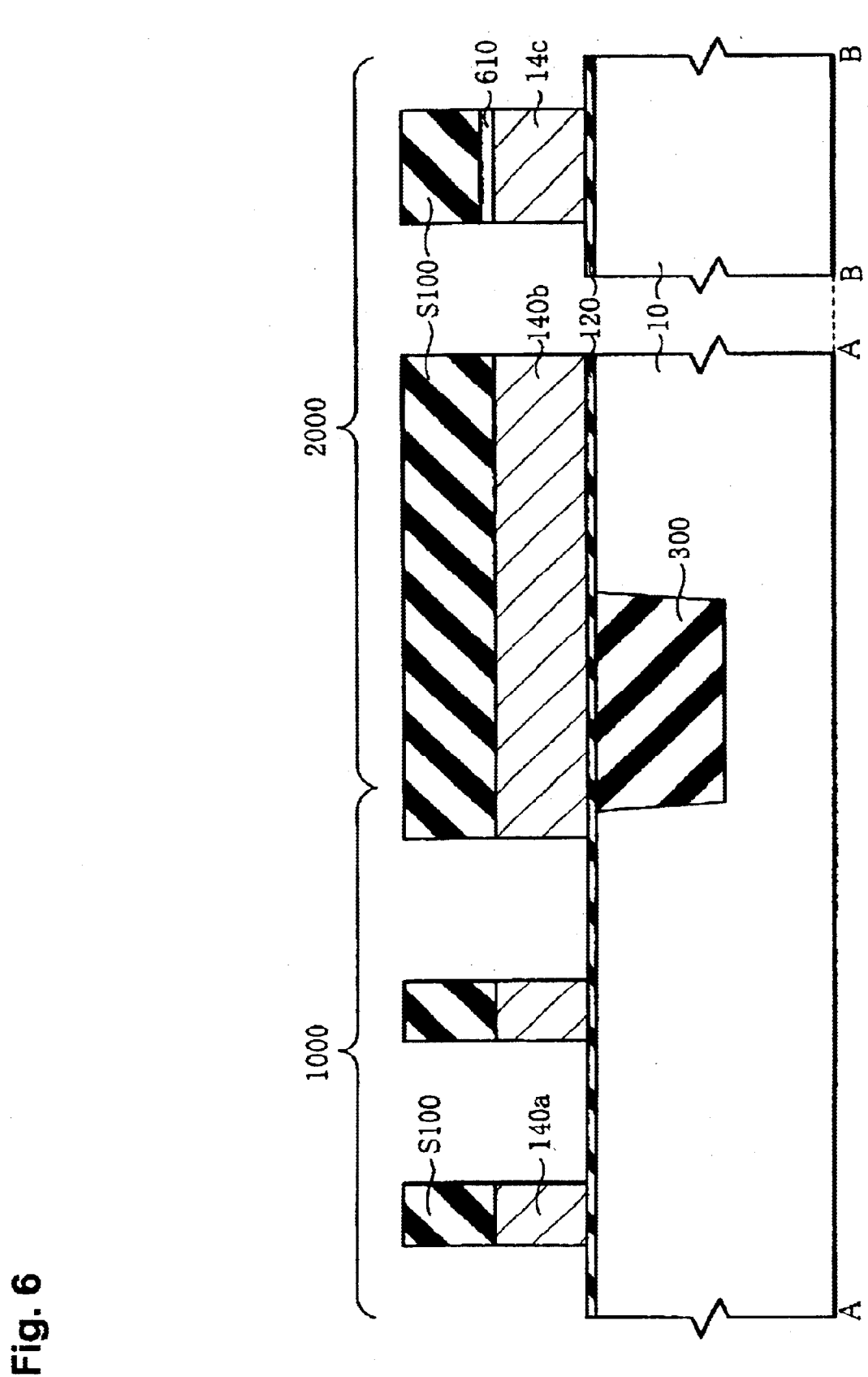
FIG. 6 shows one step in accordance with the first embodiment of the present invention.

(4) Next, a resist layer (not shown), which covers at least a region of the logic circuit region 2000 where a MOS transistor 500 is to be formed in steps to be described below and extends to a portion of the memory region 1000, is formed Then, the stopper layer S100 is patterned by using the resist layer as a mask. Next, the gate layer 140 is etched by using the patterned stopper layer as a mask. As a result, as shown in FIG. 6, the gate layer 140 is patterned and becomes the gate layers 140a in the memory region 1000. Also, the gate layer 140 in the logic circuit region 2000 is patterned in a region where the resistance element 600 is to be formed and becomes a resistance conductive layer 14c. In the meantime, in this step, the gate layer 140 within the logic circuit region 2000 in a region where the MOS transistor 500 is to be formed is not patterned (hereafter, the gate layer 140 within the logic circuit region in a region where the MOS transistor 500 is to be formed is called "140b".)

Figure 7:
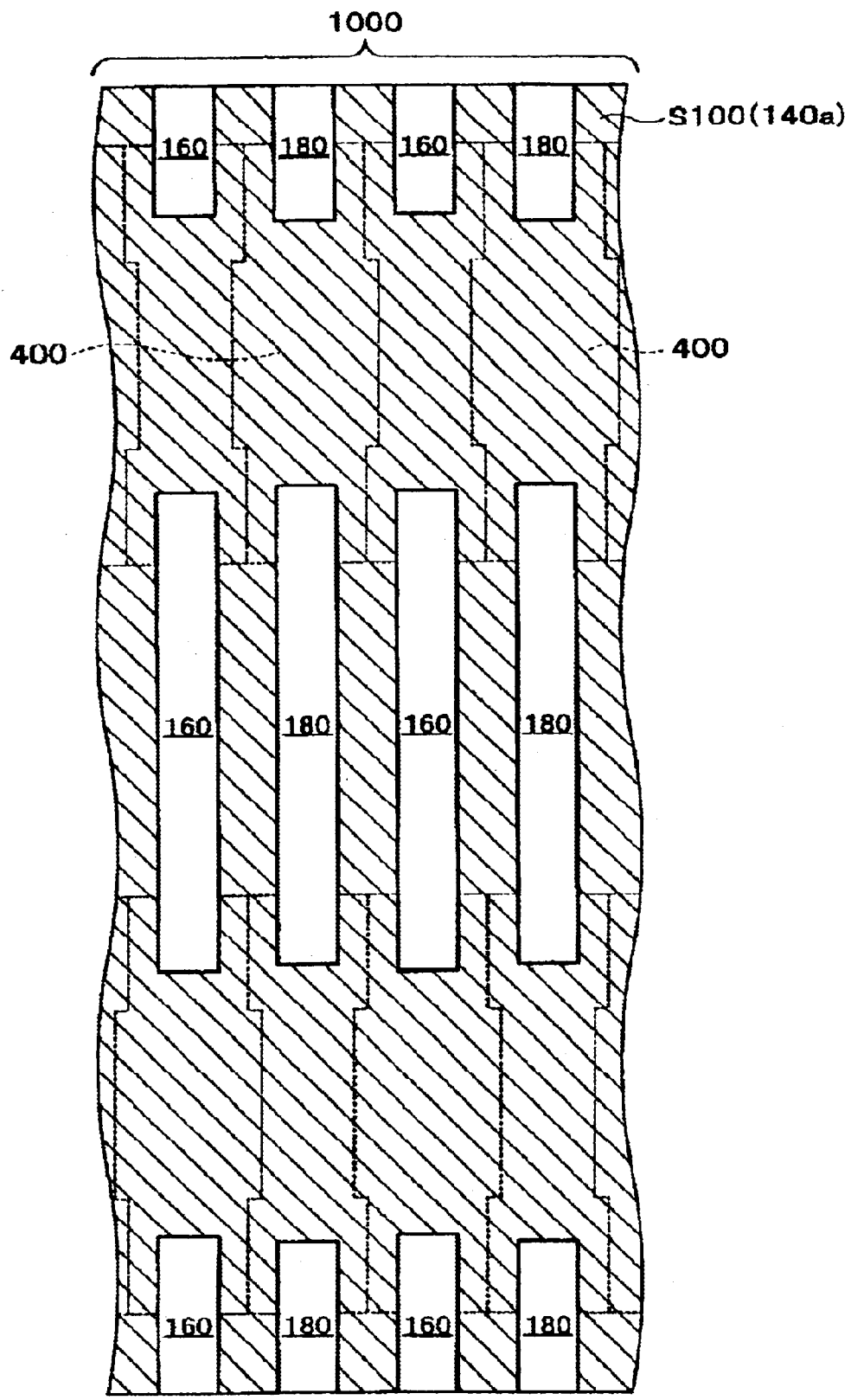
FIG. 7 shows one step in accordance with the first embodiment of the present invention.

FIG. 7 shows a plan view of the state after the patterning step. By the patterning step, opening sections 160 and 180 are provided in a stacked layered body of the gate layer 140 and the stopper layer S100 in the memory region 1000. The opening sections 160 and 180 generally correspond to regions where impurity layers 16 and 18 are formed by an ion implantation to be conducted later. Then, in subsequent steps, side dielectric layers and control gates are formed along the side surfaces of the opening sections 160 and 180.

Figure 8:
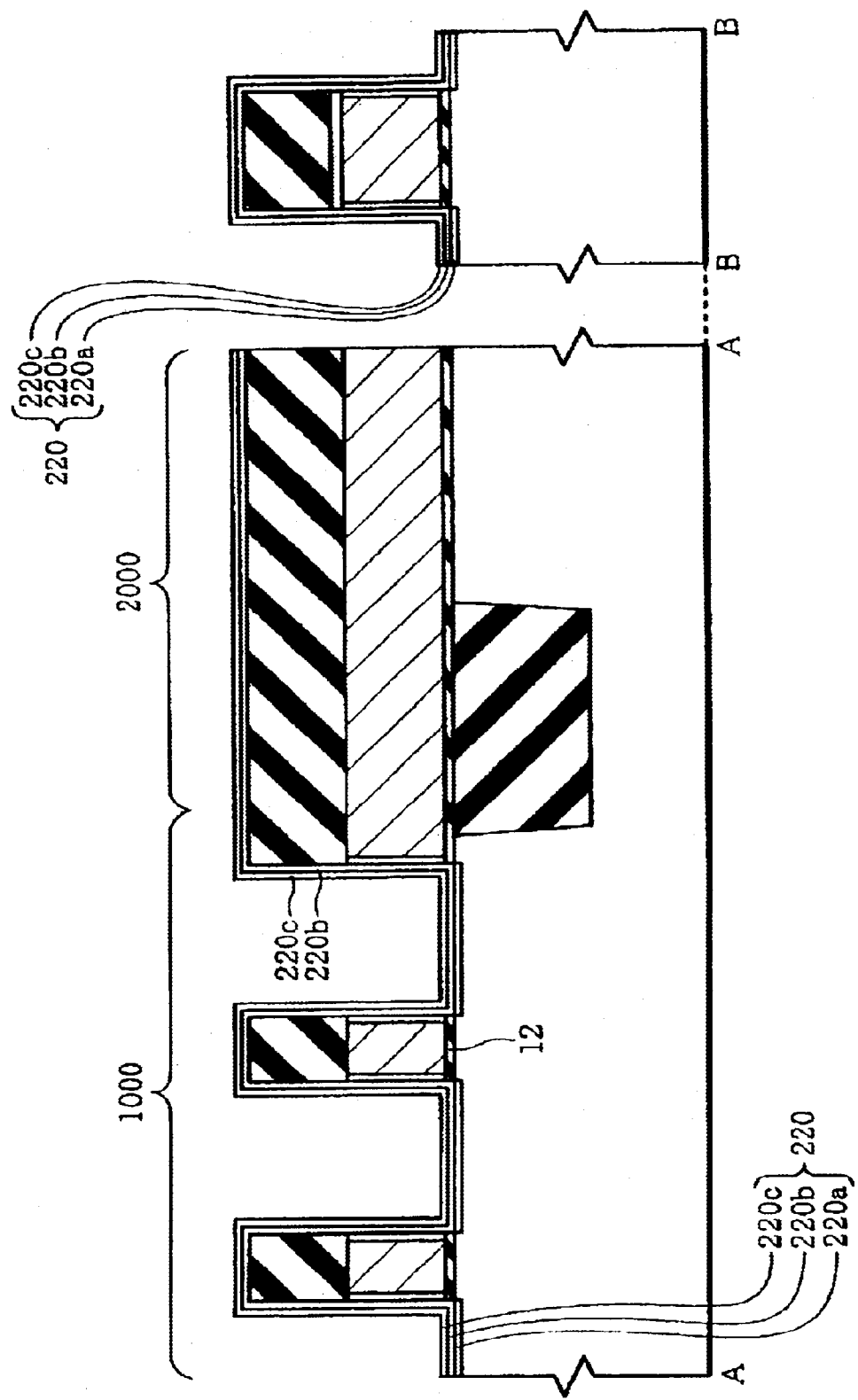
FIG. 8 shows one step in accordance with the first embodiment of the present invention.

(5) Then, the surface of the semiconductor substrate is washed with hydrofluoric acid. As a result, exposed portions of the dielectric layer 120 are removed. Next, as shown in FIG. 8, a first silicon oxide layer 220a is formed by a thermal oxidation method. The thermally oxidized films are formed between the semiconductor substrate 10 and exposed surfaces of the gate layers 140a and 140b. It is noted that a CVD method may be used to form the first silicon oxide layer 220a.

Then, an annealing treatment is conducted for the first silicon oxide layer 220a. The annealing treatment is desirably conducted in an atmosphere containing $NH_3$ gas. This pre-treatment makes it easier to evenly deposit a silicon nitride layer 220b on the first silicon oxide layer 220a. Then, the silicon nitride layer 220b is formed by a CVD method.

Next, a second silicon oxide layer 220c is formed by a CVD method, more specifically, by a high temperature oxidation (HTO) method. The second silicon oxide layer 220c may also be formed by using an ISSG (In-situ Steam Generation) treatment. Films that are formed by the ISSG treatment are dense. When films are formed by the ISSG treatment, an annealing treatment for densifying an ONO film to be described later can be omitted.

It is noted that, in the steps described above, if the silicon nitride layer 220b and the second silicon oxide layer 220c are formed in the same furnace, contamination of the interface thereof that may occur when they are taken outside the furnace can be prevented. By doing this, ONO films with a uniform quality can be formed, and therefore memory cells 100 having stable electric characteristics can be obtained. Also, a washing step that may be conducted to remove contaminants on the interface is not required, such that the number of steps can be reduced.

After forming the layers described above, an annealing treatment with, for example, a wet oxidation or an LMP oxidation may be conducted to densify each of the layers, if desired.

In accordance with the present embodiment, the ONO films 220 become second gate dielectric layer 22 and side dielectric layers 24 (see FIG. 2) through a patterning step to be conducted later.

Figure 9:
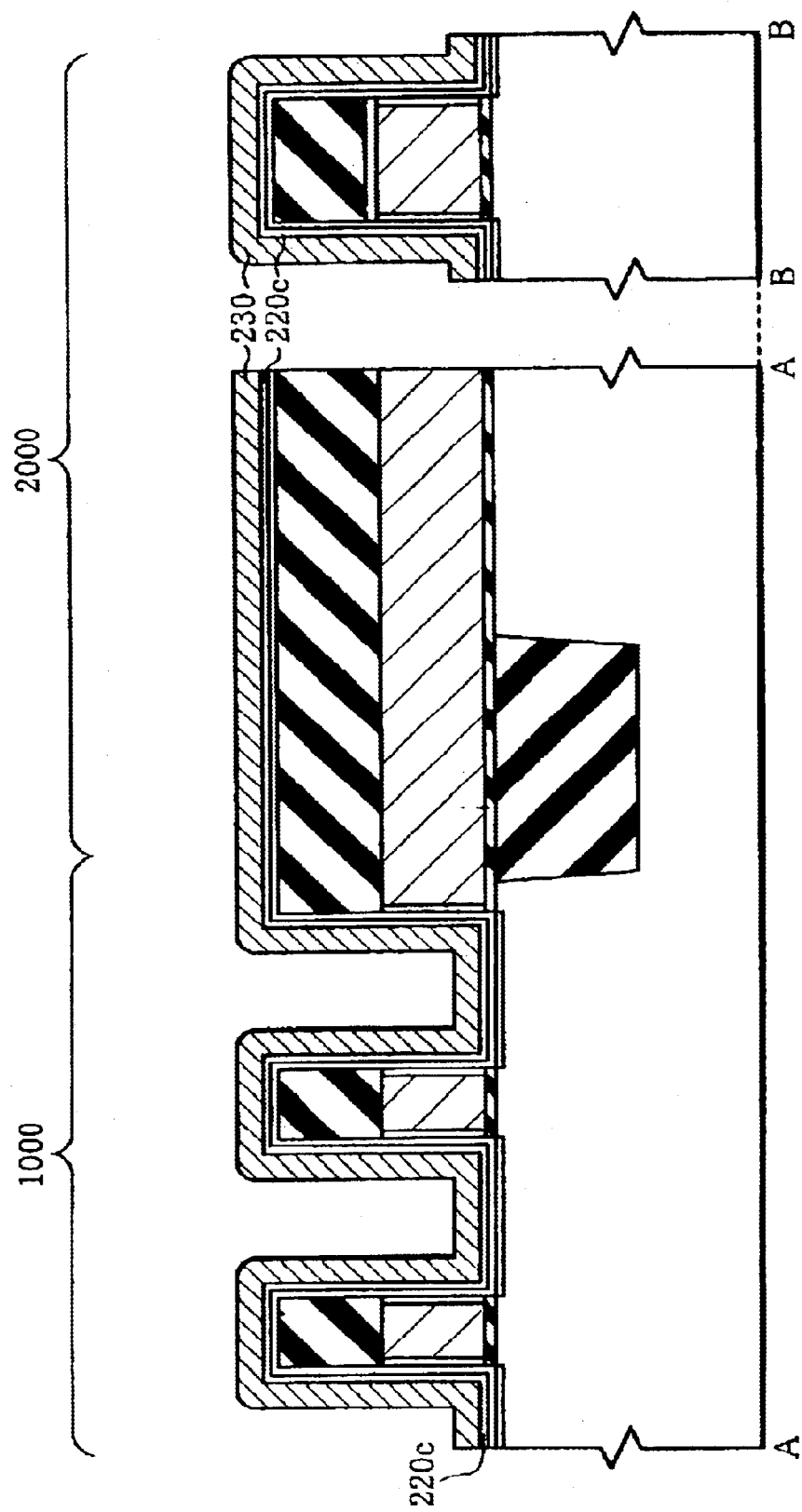
FIG. 9 shows one step in accordance with the first embodiment of the present invention.

(6) As shown in FIG. 9, a doped polysilicon layer (second conductive layer) 230 is formed over the second silicon oxide layer 220c. The doped polysilicon layer 230 will be etched later and become conductive layers 40 that compose control gates 20 and 30 (see FIG. 1).

Figure 10:
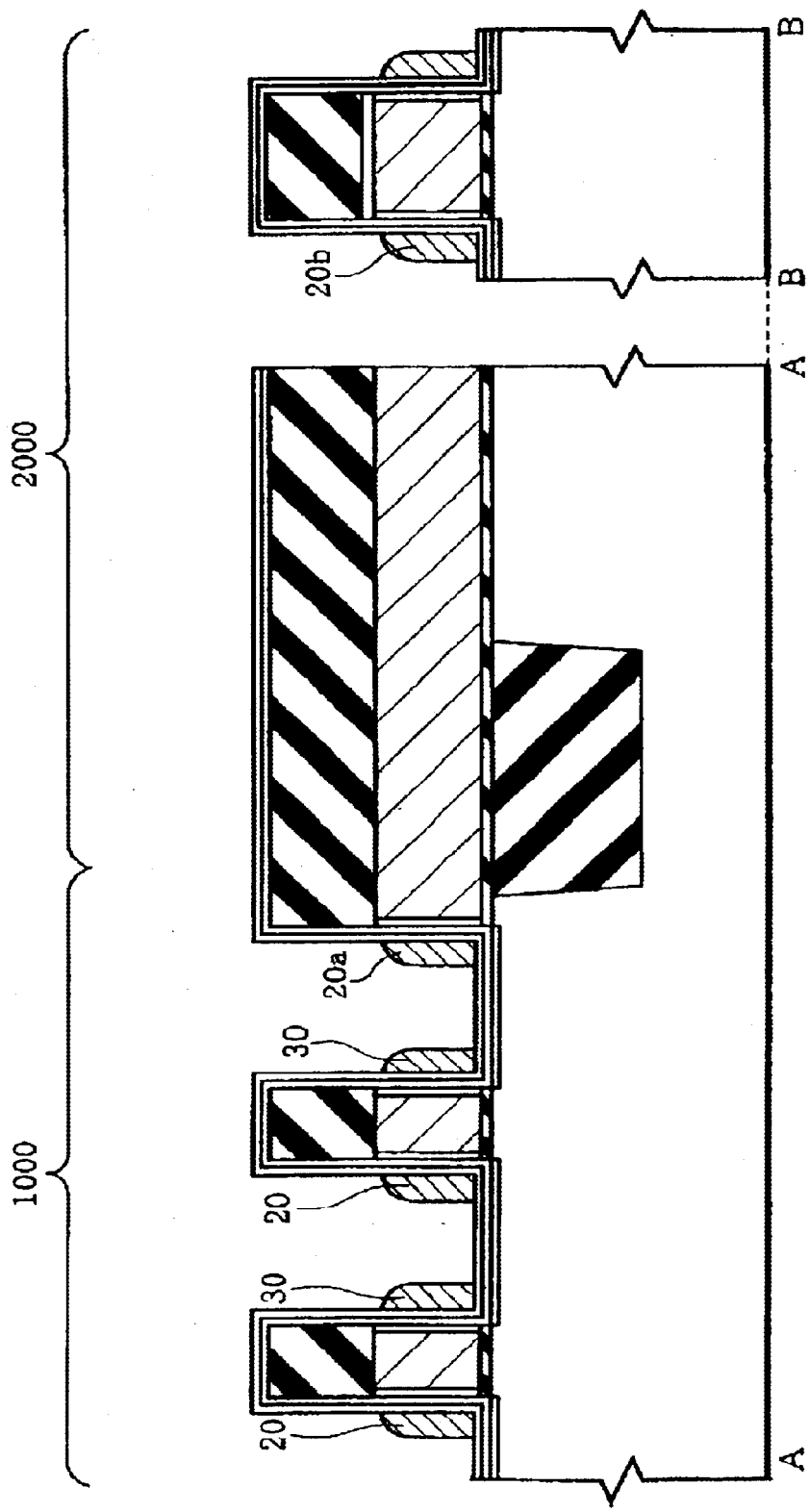
FIG. 10 shows one step in accordance with the first embodiment of the present invention.

(7) Then, as shown in FIG. 10, the doped polysilicon layer 230 is anisotropically etched. Here, the anisotropic etching is conducted until upper surfaces of the formed control gates 20 and 30 become lower than upper surfaces of the gate layers 140a. As a result, the first and second control gates 20 and 30 are formed on sidewalls of the gate layer 140a and the stopper layer S100. It is noted that the doped polysilicon layer 230 deposited on the second silicon oxide layer 220c in the logic circuit region 2000 is almost entirely removed at this stage.

Figure 11:
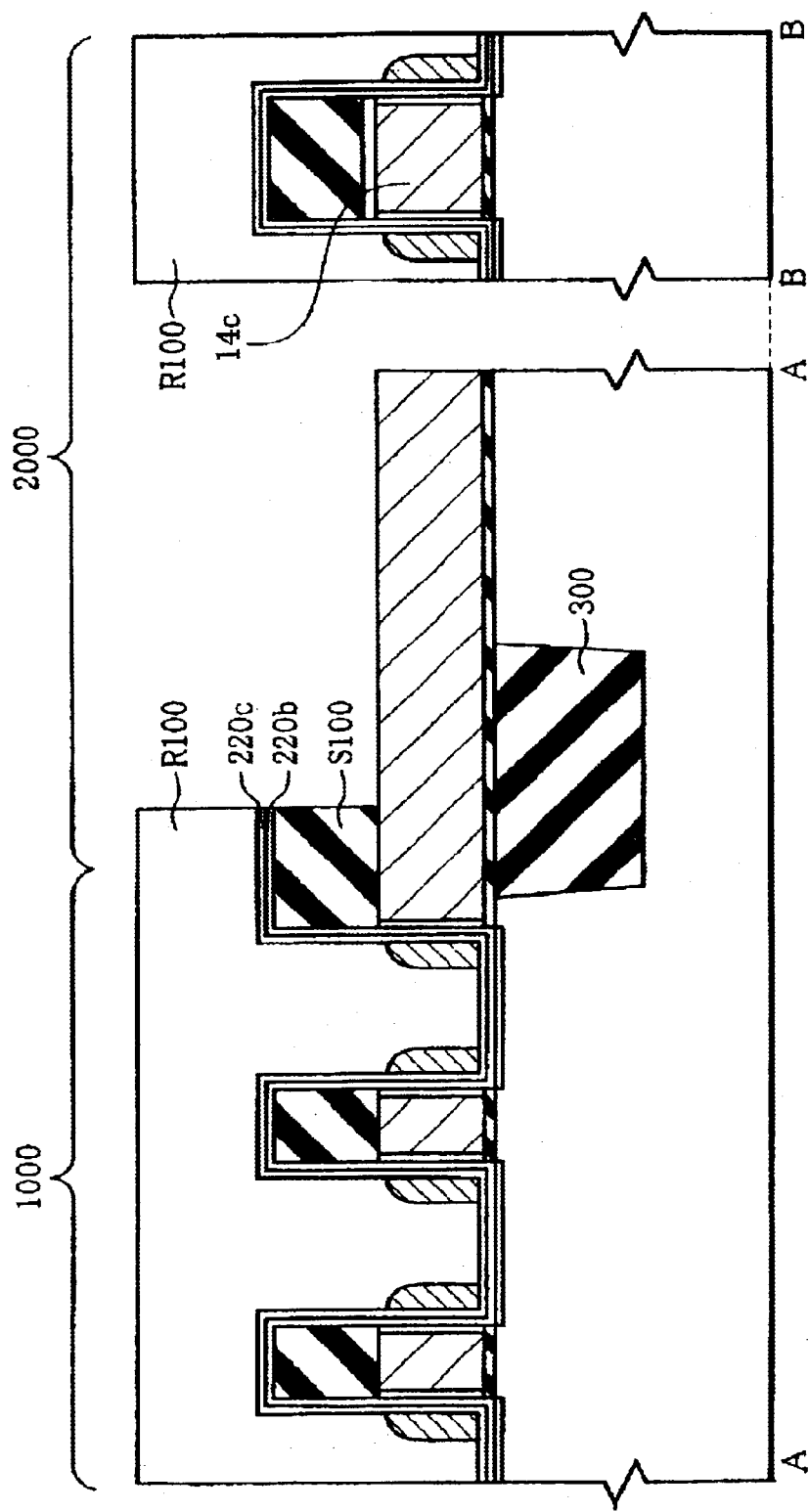
FIG. 11 shows one step in accordance with the first embodiment of the present invention.

(8) As shown in FIG. 11, a resist layer R100, which covers the entire area of the memory region 1000, extends to a portion of the logic circuit region, and covers a region where the resistance conductive layer 14c is formed. Then, the second silicon oxide layer 220c, the silicon nitride layer 220b and the stopper layer S100 in the logic circuit region 2000 are removed, using the resist layer R100 as a mask. By this etching step, the stopper layer S100 within the logic circuit region 2000 that is not covered by the resist layer R100 is removed.

Figure 12:
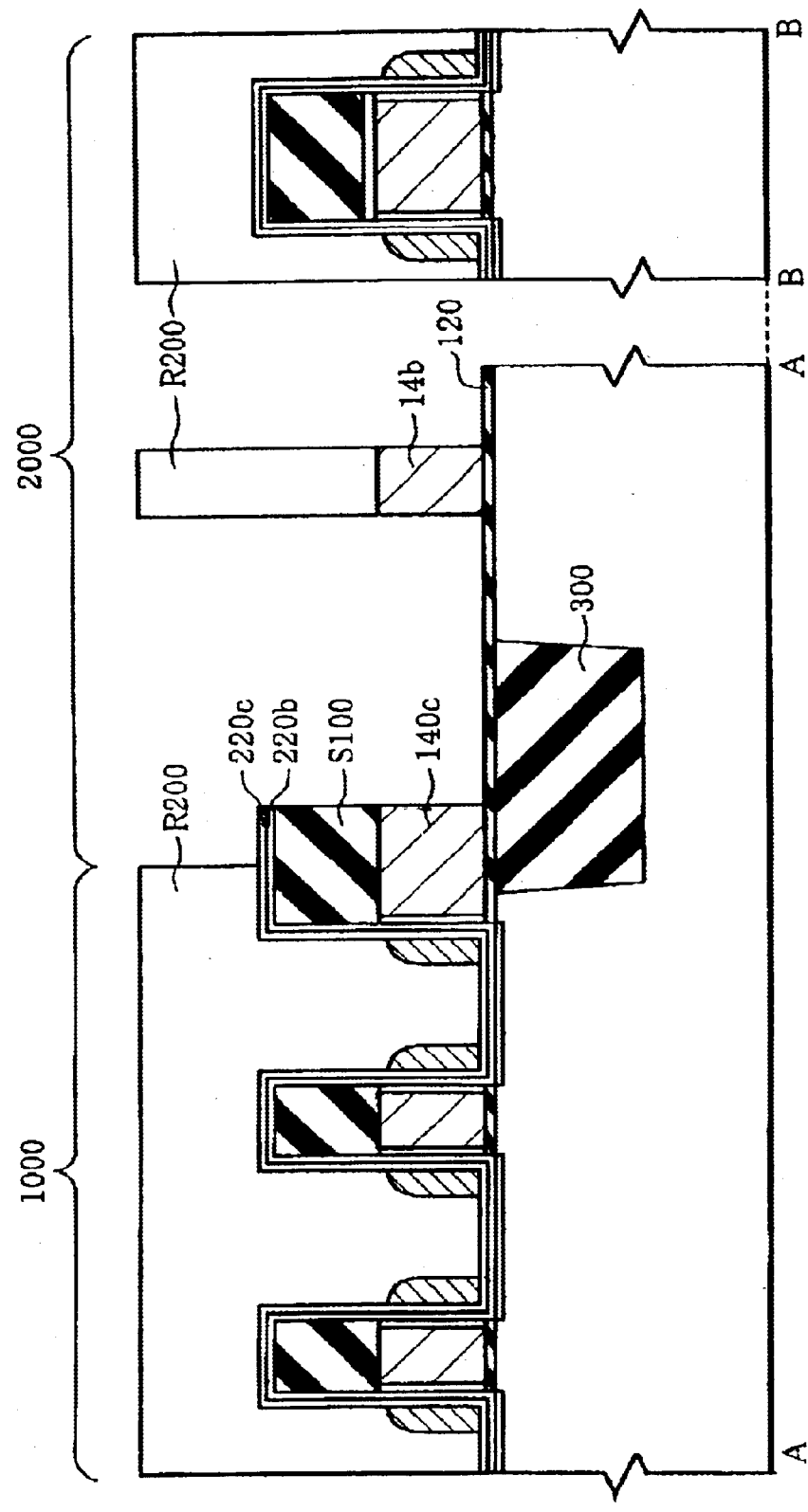
FIG. 12 shows one step in accordance with the first embodiment of the present invention.

(9) As shown in FIG. 12, a resist layer R200 for forming gate electrodes 14b is formed. The resist layer R200 is patterned in a manner to cover the memory region 1000 and areas in the logic circuit region 2000 where the MOS transistor 500 and the resistance conductive layer 14c are to be formed. Then, by etching the gate layer 140b using the resist layer R200 as a mask, gate electrodes 14b are formed in the logic circuit region 2000. Thereafter, the resist layer R2 is removed.

Figure 13:
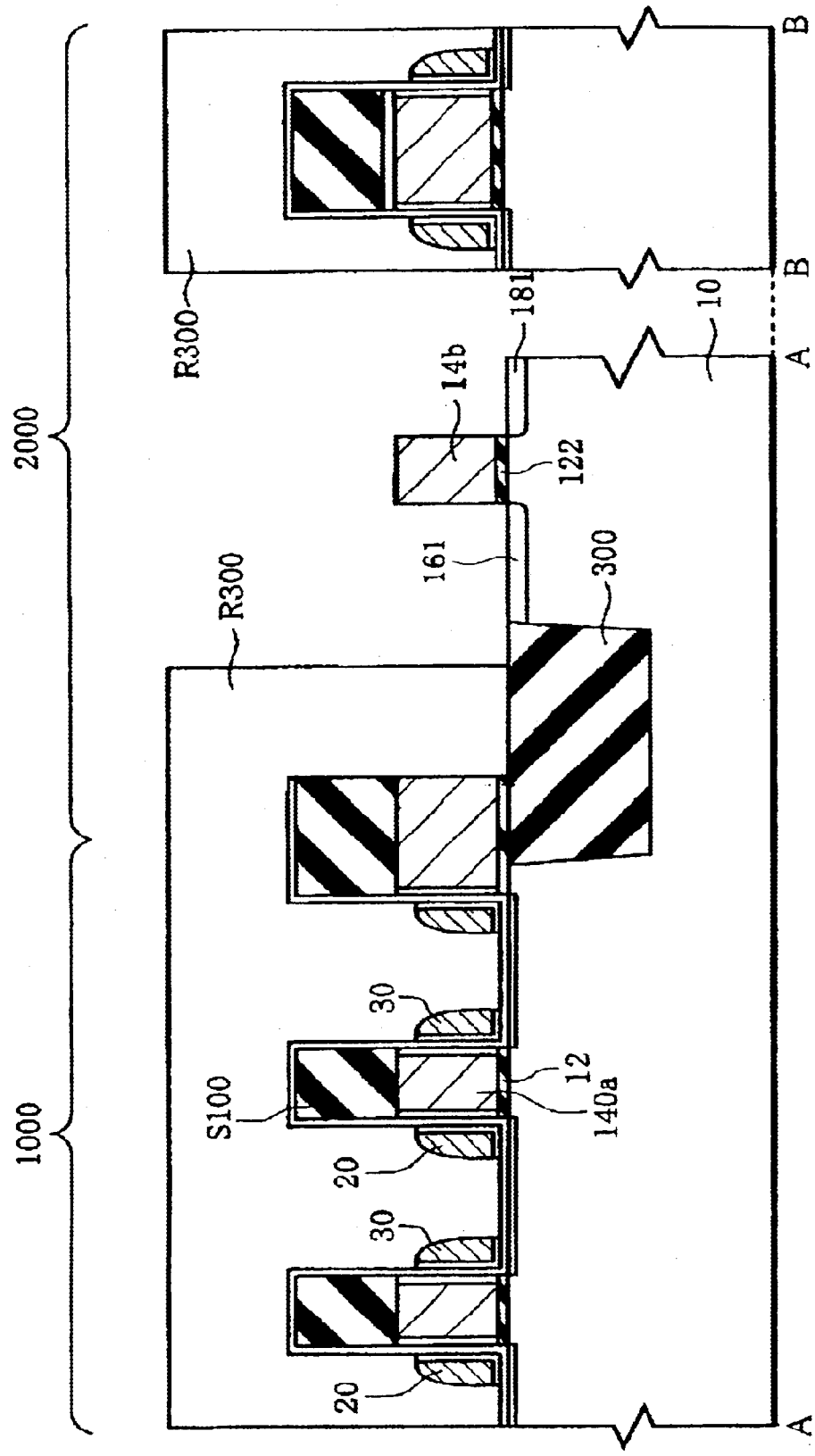
FIG. 13 shows one step in accordance with the first embodiment of the present invention.

(10) Then, the surface of the semiconductor substrate is washed with hydrofluoric acid. As a result, exposed portions of the dielectric layer 120 and the second silicon oxide layer 220c are removed. Then, as shown in FIG. 13, a resist layer R300, which covers the memory region 1000 and at least an area among the logic circuit region 2000 where the resistance conductive layer 14c is located, is formed. By doping an N-type impurity by using the resist layer R300 as a mask, extension layers 161 and 181 for source and drain regions are formed in the logic circuit region 2000. Then, the resist layer R300 is removed.

Figure 14:
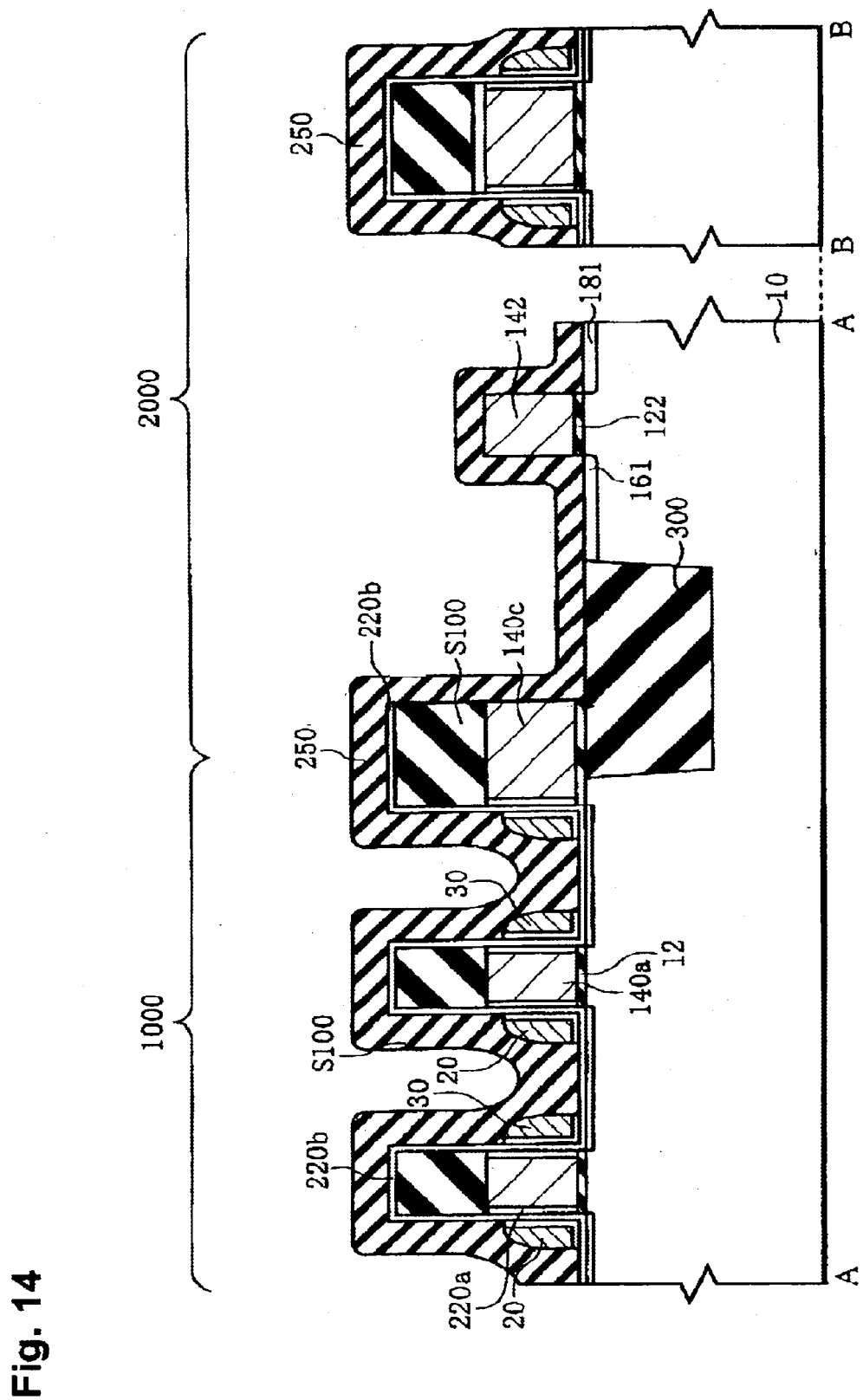
FIG. 14 shows one step in accordance with the first embodiment of the present invention.

(11) As shown in FIG. 14, a dielectric layer 250 such as a silicon oxide layer or a silicon nitride layer is formed over an entire surface in the memory region 1000 and the logic circuit region 2000.

Figure 15:
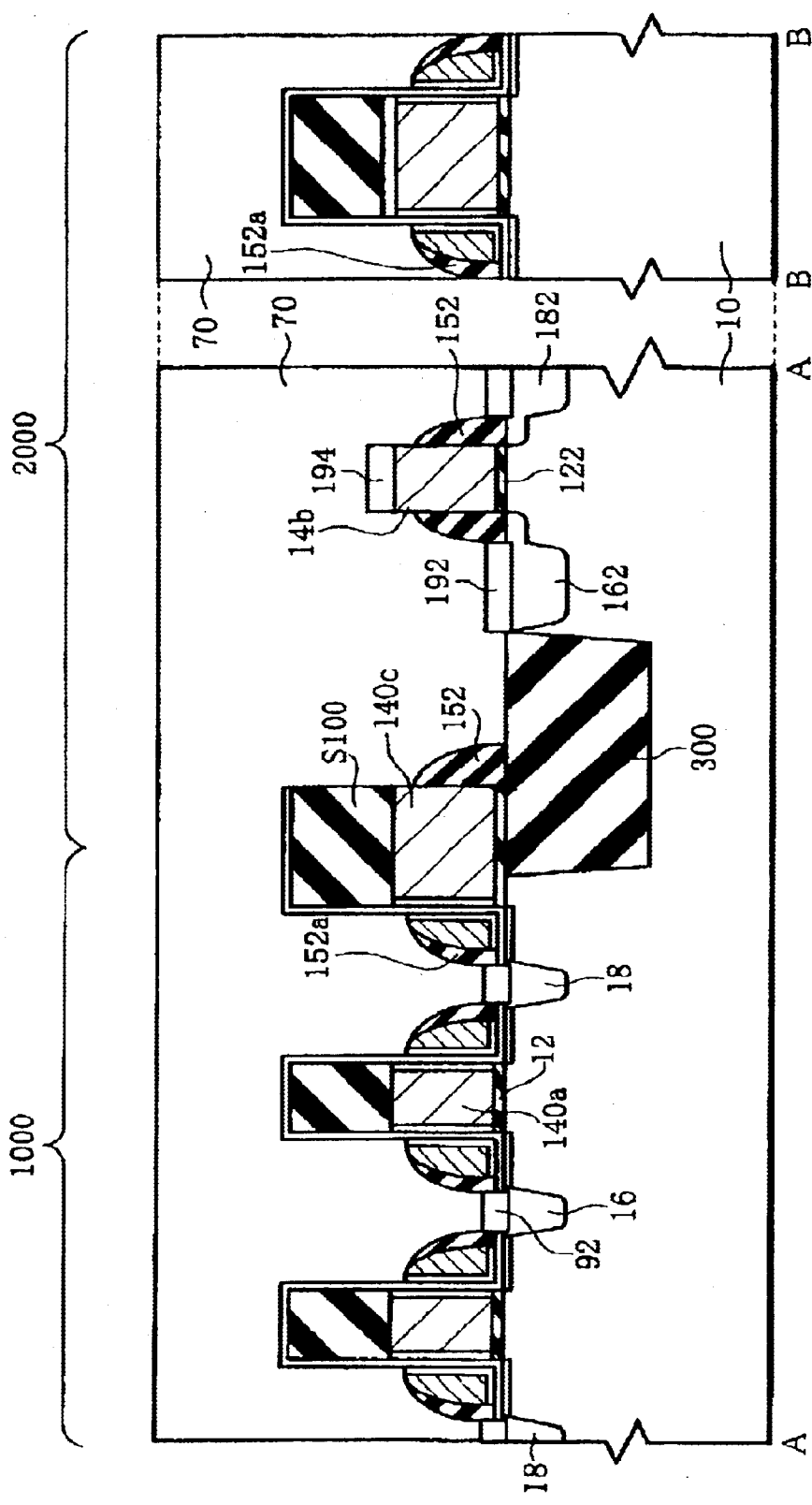
FIG. 15 shows one step in accordance with the first embodiment of the present invention.

(12) As shown in FIG. 15, by anisotropically etching the dielectric layer 250, sidewall dielectric layers 152 are formed on both side surfaces of the gate electrode 14b in the logic circuit region 2000. At the same time, dielectric layers 152a are left on the control gates 20 and 30. In addition, this etching step removes the dielectric layers deposited on regions where silicide layers are to be formed in a succeeding step, and the semiconductor substrate is exposed.

Then, by ion-implanting an N-type impurity, impurity layers 16 and 18 that each compose a source region or a drain region in the memory region 1000, and impurity layers 162 and 182 that each compose a source region or a drain region in the logic circuit region 2000 are formed in the semiconductor substrate 10.

Then, a metal for forming suicide is deposited over the entire surface thereof The metal for forming silicide may be, for example, titanium or cobalt. Thereafter, the metal formed on the impurity layers 16, 18, 162 and 182 and on the gate electrode 14b is silicified to form silicide layers 92 on upper surfaces of the impurity layers 16 and 18, silicide layers 192 on upper surfaces of the impurity layers 162 and 182, and silicide layer 194 on upper surfaces of the gate electrodes 14b. Then, a dielectric layer (i.e., a third dielectric layer) 70 such as a silicon oxide layer or a silicon nitride layer is formed over the entire surface of the memory region 1000 and the logic circuit region 2000. The dielectric layer 70 is formed in a manner to cover the stopper layers S100.

Figure 16:
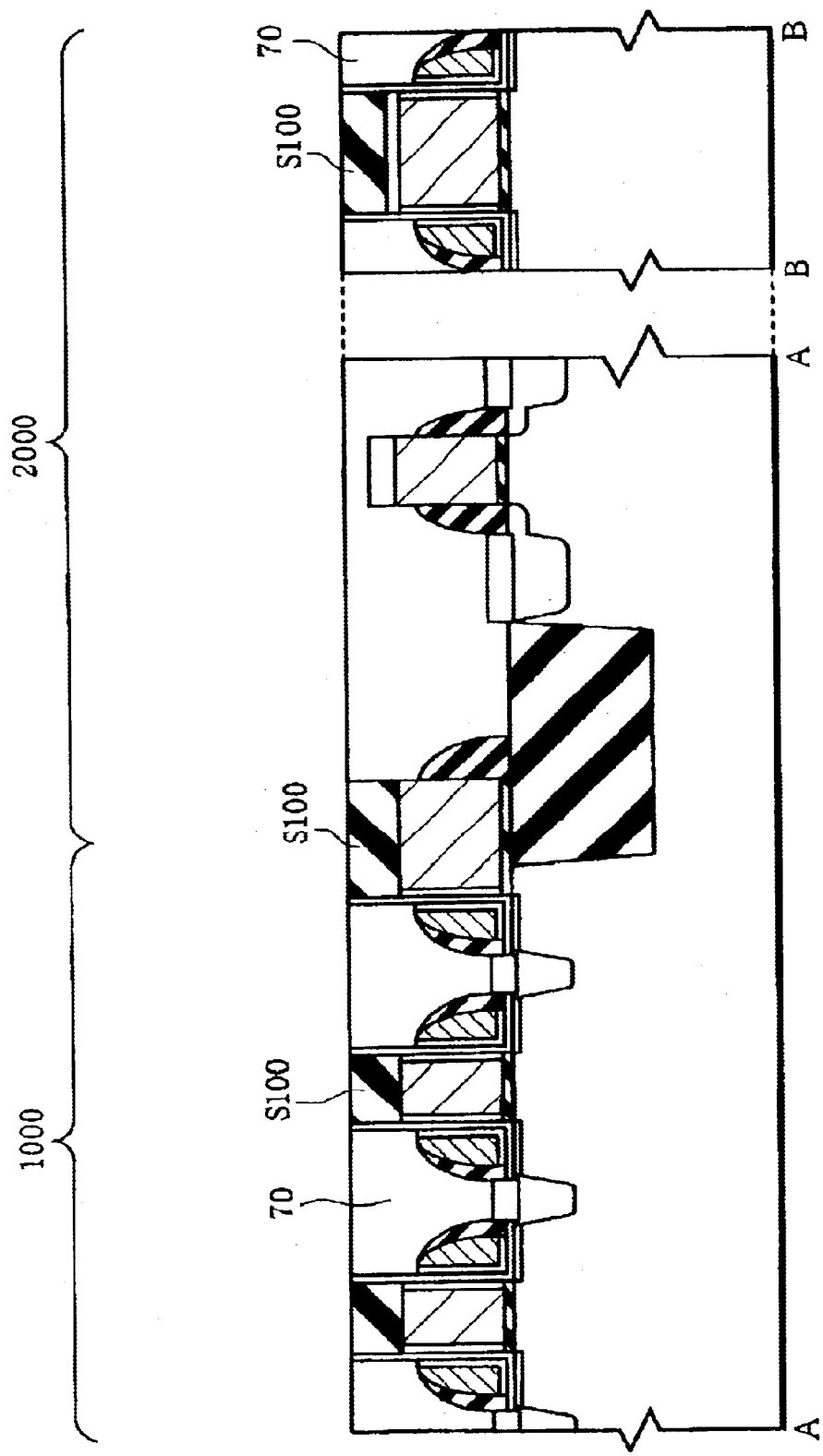
FIG. 16 shows one step in accordance with the first embodiment of the present invention.

(13) As shown in FIG. 16, the dielectric layer 70 is polished by a CMP method until the stopper layers S100 is exposed, thereby planarizing the dielectric layer 70. This polishing step leaves the dielectric layer 70 between two side dielectric layers 24 opposing each other across the control gates 20 and 30. At this time, the MOS transistor 500 is completely covered by the dielectric layer 70.

(14) The stopper layer S100 is removed by heated phosphoric acid. As a result, at least upper surfaces of the gate layers 140a are exposed. Then, a doped polysilicon layer (i.e., a second conductive layer) is deposited over the entire surface thereof.

Figure 17:
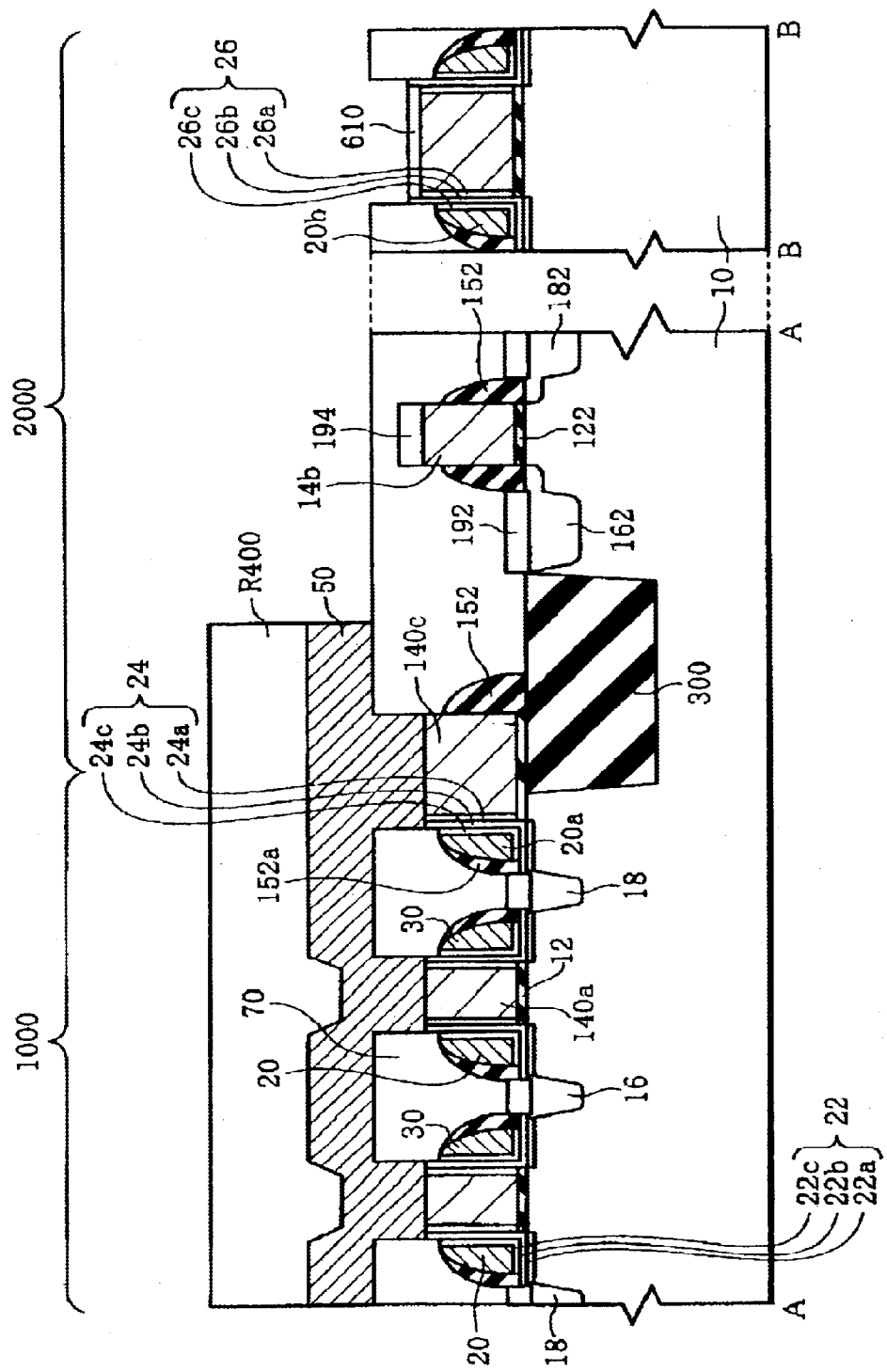
FIG. 17 shows one step in accordance with the first embodiment of the present invention.

Then, as shown in FIG. 17, patterned resist layers R400 are formed over the doped polysilicon layer. By patterning the doped polysilicon layer using the resist layers R400 as a mask, word lines 50 are formed.

In succession, the gate layers 140a are etched by using the resist layers R400 as a mask. By this etching, the gate layers 140a without the word lines 50 formed on them are removed. As a result, word gates 14a arranged in an array can be formed. The regions where the gate layers 140a are removed correspond to regions where P-type impurity layers (element isolation impurity layers) 15 are to be formed later (see FIG. 1).

In this etching step, the conductive layers 40 that form the first and second control gates 20 and 30 remain without being etched because they are covered by the dielectric layers 70. Also, the MOS transistors 500 in the logic circuit region 2000 are not affected by the etching because they are completely covered by the dielectric layer 70. Furthermore, the resistance element 600 in the logic circuit region 2000 is not affected by the etching because the dielectric layer 610 is formed above the resistance conductive layer 14c.

Then, a P-type impurity is doped over the entire surface of the semiconductor substrate 10. As a result, P-type impurity layers 15 (element isolation impurity layers, see FIG. 1) are formed in regions between the word gates 14a in the Y direction. By these P-type impurity layers 15, the non-volatile semiconductor memory devices 100 are more surely isolated from one another.

By the steps described above, the semiconductor device shown in FIGS. 1 and 2 is manufactured.

The manufacturing method has the following advantages.

First, in the step (14) described above, when the gate layer 140a is etched, the dielectric layer 610 can function as an etching stopper layer. In other words, since the dielectric layer 610 is formed above the resistance conductive layer 14c, the resistance conductive layer 14c is prevented from being etched when the gate layer 140a is etched.

Secondly, in the step (12) described above, since the dielectric layer 610 is formed above the resistance conductive layer 14c, the upper surface of the resistance conductive layer 14c is prevented from being silicidized when the silicide layer 194 is formed on the upper surface of the gate electrode 14b.

Second Embodiment

Figure 18:
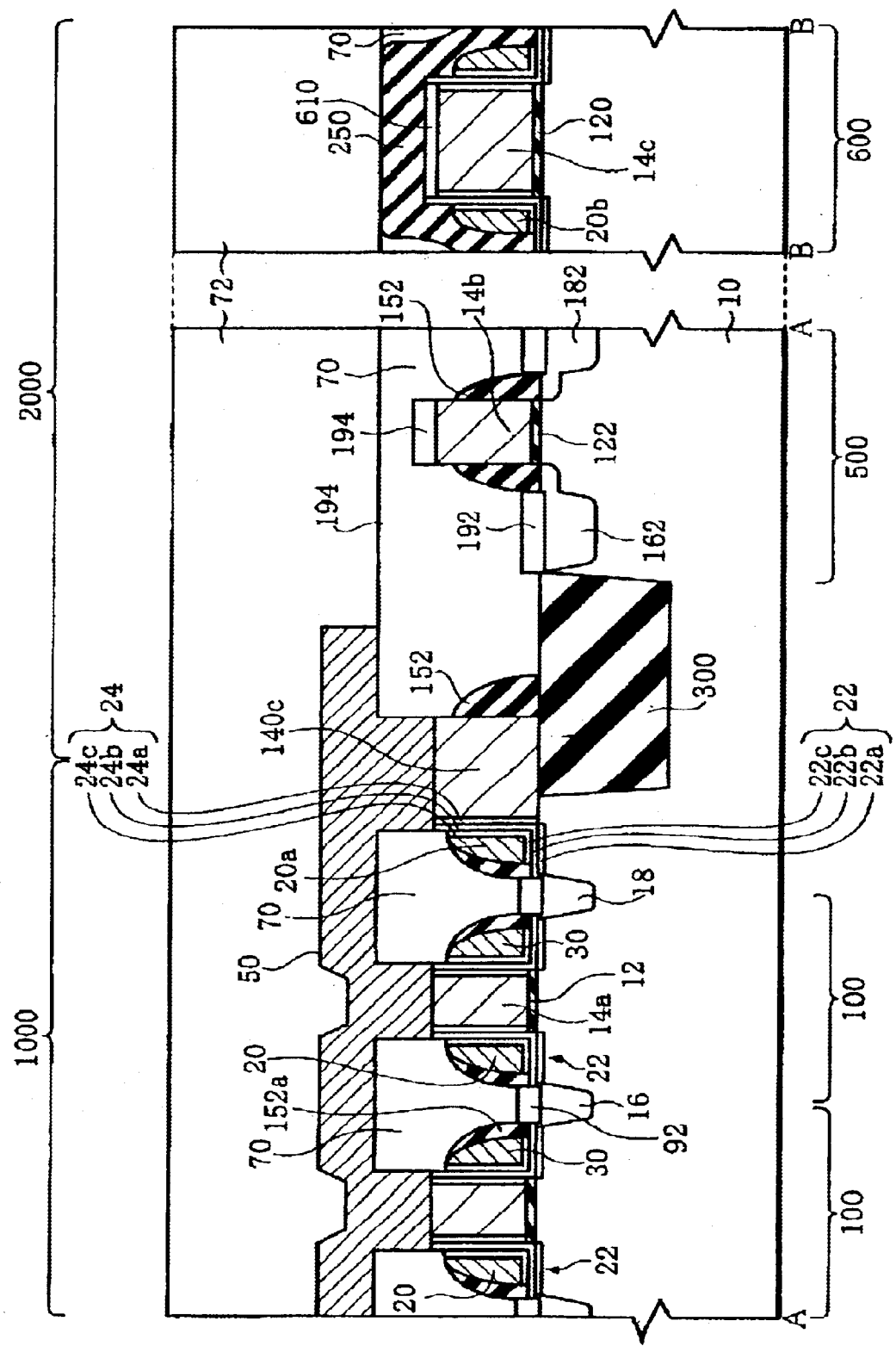
FIG. 18 shows one step in accordance with a second embodiment of the present invention.

1. Structure of a Semiconductor Device:

FIG. 18 is a plan view illustrating a layout of a semiconductor device that is obtained by a manufacturing method in accordance with a second embodiment of the present invention. It is noted that, in the second embodiment, sections that are substantially the same as those in the first embodiment are assigned the same reference numbers, and descriptions thereof are not repeated.

The semiconductor device in accordance with the second embodiment is generally the same as the first embodiment except that a dielectric layer 250 is formed above the resistance conductive layer 14c of the resistance element 600. In other words, a dielectric layer formed above the resistance conductive layer 14c of the resistance element 600 is a stacked layered body of the dielectric layer 610 and the dielectric layer (a second dielectric layer in the present embodiment) 250. However, in the present embodiment, the dielectric layer 610 is not necessarily required.

2. Method for Manufacturing a Semiconductor Device:

Next, a method for manufacturing a semiconductor device in accordance with the second embodiment of the present invention will be described with reference to FIGS. 19–21.

The semiconductor device in accordance with the present embodiment is formed by conducting the following steps after the steps (1)–(10) in the manufacturing steps of the first embodiment (see FIGS. 3–13). However, in the present embodiment, the dielectric layer 610 is not necessarily required. Accordingly, when the dielectric layer 610 is not formed, steps corresponding to the steps of forming the dielectric layer 610 in the first embodiment are omitted.

Figure 19:
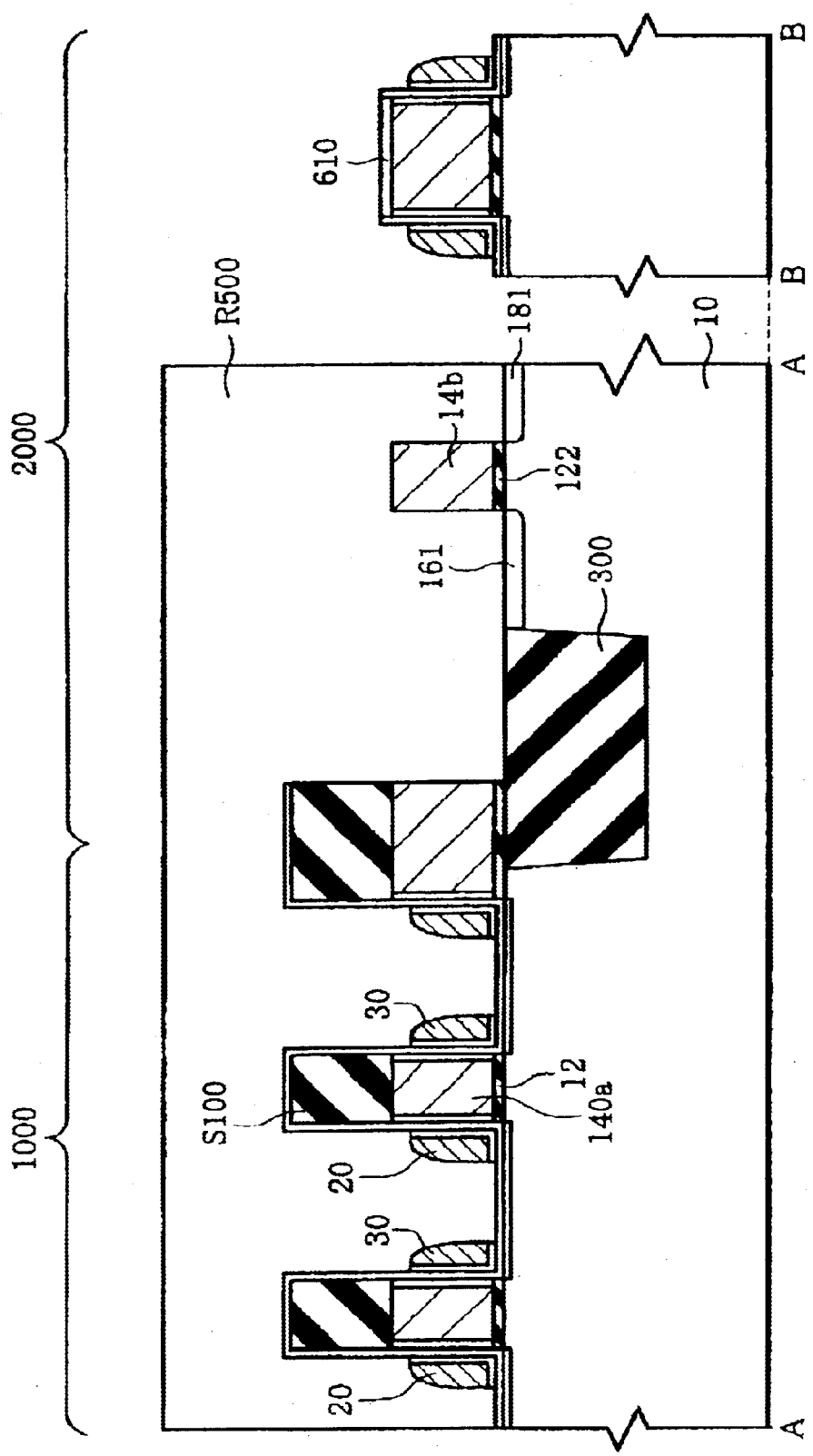
FIG. 19 shows one step in accordance with the second embodiment of the present invention.

First, as shown in FIG. 19, a resist layer R500 is formed in a region except where the resistance element 600 is located. Then, the stopper layer S100 that is formed above the resistance conductive layer 14c is removed, using the resist layer R500 as a mask.

Figure 20:
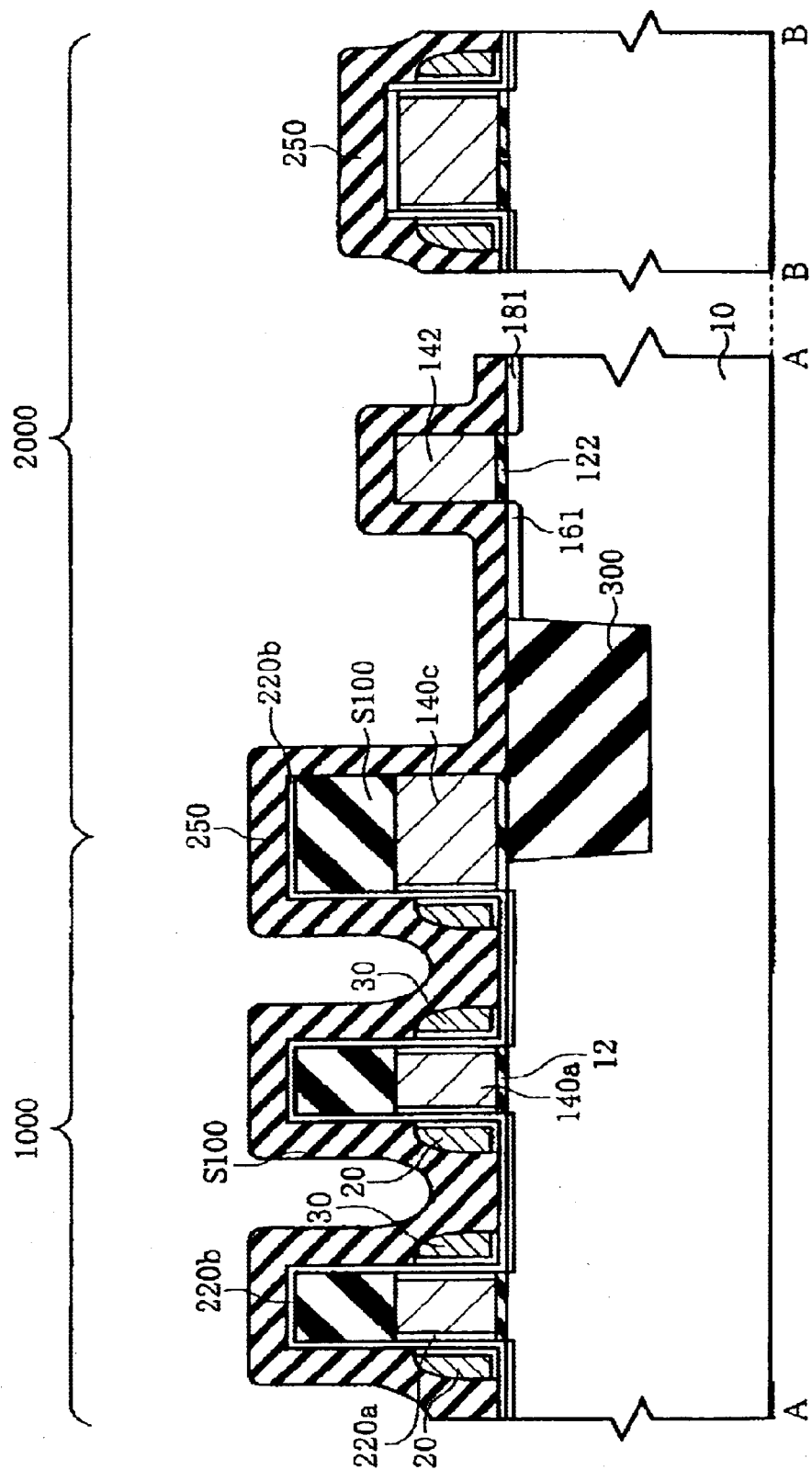
FIG. 20 shows one step in accordance with the second embodiment of the present invention.
Figure 21:
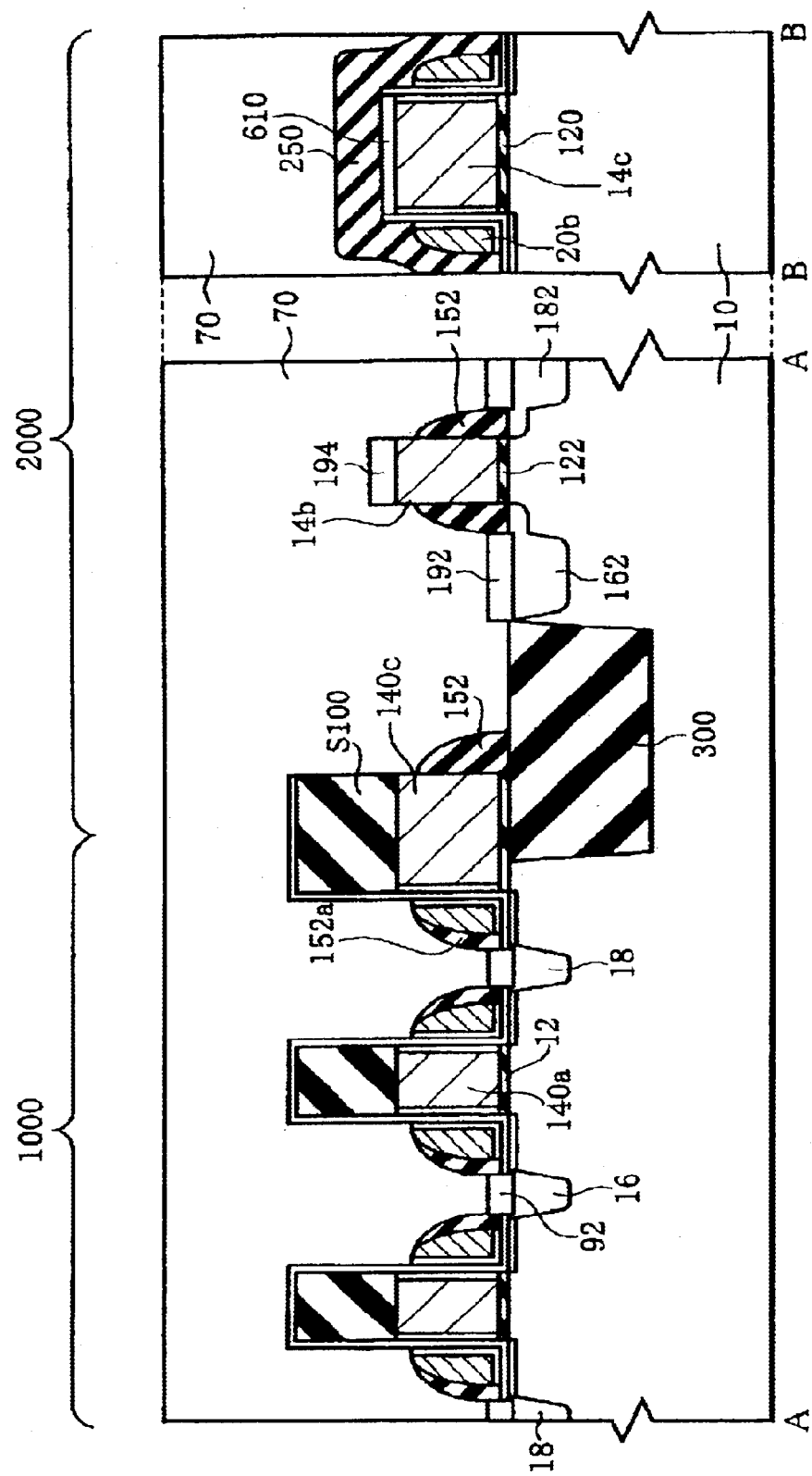
FIG. 21 shows one step in accordance with the second embodiment of the present invention.
Figure 22:
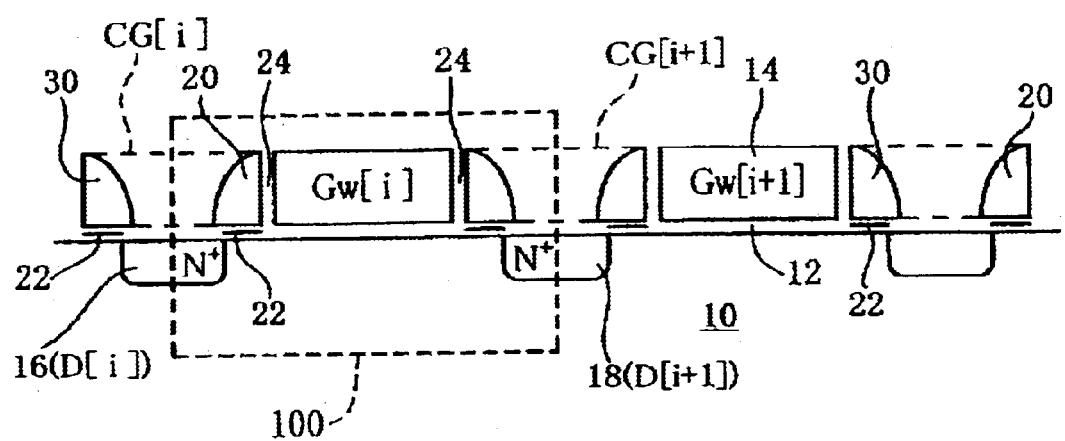
FIG. 22 shows a cross-sectional view of a known MONOS type memory cell.

Then, as shown in FIG. 20, a dielectric layer 250 such as a silicon oxide layer or a silicon nitride layer is formed over the entire surface in the memory region 1000 and the logic circuit region 2000.

Next, a resist (not shown) that only covers the resistance element 600 is formed. The dielectric layer (the second dielectric layer in the present embodiment) 250 is anisotropically etched, using the resist as a mask, as shown in FIG. 21. As a result, in the logic circuit region 2000, sidewall dielectric layers 152 are formed on both side surfaces of the gate electrode 14b, and dielectric layers 152a are formed on the control gates 20 and 30. In this case, the dielectric layer 250 that covers the resistance conductive layer 14c is not etched.

Then, the aforementioned step (12) of forming sources and drains is conducted. After the step of forming sources and drains, the same steps as conducted in manufacturing a semiconductor device in accordance with the first embodiment are conducted.

By the steps described above, the semiconductor device shown in FIG. 18 can be manufactured.

The manufacturing method of this embodiment has the following advantages.

First, in the step corresponding to the step (14) in manufacturing a semiconductor device (as described in accordance with the first embodiment), when the gate layer 140a is etched, the dielectric layer 250 can function as an etching stopper layer. In other words, since the dielectric layer 250 is formed above the resistance conductive layer 14c, the resistance conductive layer 14c is prevented from being etched when the gate layer 140a is etched. Also, while the dielectric layer 610 in the first embodiment is formed by a thermal oxidation, the dielectric layer 250 in accordance with the present embodiment is formed by a CVD method. Accordingly, the film thickness of the dielectric layer 250 can be readily made greater compared to the dielectric layer 610, and therefore it can more surely function as an etching stopper.

Secondly, in the step corresponding to the step (12) in the manufacturing method according to the first embodiment, since the dielectric layer 250 is formed above the resistance conductive layer 14c, the upper surface of the resistance conductive layer 14c is prevented from being silicidized when the silicide layer 194 is formed on the upper surface of the gate electrode 14b.

Embodiments of the present invention have been described so far. However, the present invention is not limited to these embodiments, and many modifications can be made within the scope of the subject matter of the present invention. For example, although a semiconductor substrate in a bulk form is used as a semiconductor layer in the above embodiments, a semiconductor layer composed of a SOI substrate may be used.

The entire disclosure of Japanese Patent Application No. 2002-060750 filed Mar. 6, 2002 is incorporated by reference.

What is claimed is:

1. A method for manufacturing a semiconductor device including a non-volatile memory device, and a resistance element including a resistance conductive layer, the method comprising the steps of:

forming a first dielectric layer above a semiconductor layer;

forming a first conductive layer above the first dielectric layer;

forming a second dielectric layer above a portion of the first conductive layer that becomes the resistance conductive layer;

forming a stopper layer above the first conductive layer and the second dielectric layer;

patterning the stopper layer and the first conductive layer to form a gate layer;

patterning the stopper layer, the second dielectric layer and the first conductive layer to form the resistance conductive layer;

forming sidewall control gates through an ONO film on both side surfaces of the gate layer;

forming a third dielectric layer above the gate layer and the resistance conductive layer;

polishing the third dielectric layer such that the stopper layer is exposed;

removing the stopper layer;

forming a second conductive layer above the gate layer and the resistance conductive layer;

patterning the second conductive layer to form a word line; and patterning the gate layer to form a word gate.

2. A method for manufacturing a semiconductor device including a non-volatile memory device and a resistance element including a resistance conductive layer, the method comprising the steps of:

forming a first dielectric layer above a semiconductor layer;

forming a first conductive layer above the first dielectric layer;

forming a stopper layer above the first conductive layer;

patterning the stopper layer and the first conductive layer to form a gate layer and the resistance conductive layer;

forming sidewall control gates through an ONO film on both side surfaces of the gate layer;

removing the stopper layer formed above the resistance conductive layer;

forming a second dielectric layer above at least the resistance conductive layer;

forming a third dielectric layer above the gate layer and the resistance conductive layer;

polishing the third dielectric layer such that the stopper layer is exposed, and the second dielectric layer formed above the resistance conductive layer remains;

removing the stopper layer;

forming a second conductive layer above the gate layer and the resistance conductive layer;

patterning the second conductive layer to form a word line; and patterning the gate layer to form a word gate.

3. A method for manufacturing a semiconductor device including a non-volatile memory device and a resistance element including a resistance conductive layer, the method comprising the steps of:

patterning a stopper layer and a first conductive layer to form a gate layer;

patterning the stopper layer, a dielectric layer and the first conductive layer to form a resistance conductive layer;

forming sidewall control gates on both side surfaces of the gate layer through ONO films at least within a memory region of the semiconductor device;

forming a second conductive layer above the gate layer and the resistance conductive layer;

forming a word line by patterning the second conductive layer; and forming a word gate by patterning the gate layer.

* * * * *